US010648934B2

(12) United States Patent
Kim et al.

(10) Patent No.: US 10,648,934 B2
(45) Date of Patent: May 12, 2020

(54) SYSTEMS, APPARATUSES, AND METHODS FOR OPTICAL FOCUSING IN SCATTERING SAMPLES

(71) Applicants: Donggyu Kim, Cambridge, MA (US); Dirk Robert Englund, Brookline, MA (US)

(72) Inventors: Donggyu Kim, Cambridge, MA (US); Dirk Robert Englund, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/250,524

(22) Filed: Jan. 17, 2019

(65) Prior Publication Data

US 2019/0219527 A1    Jul. 18, 2019

Related U.S. Application Data

(60) Provisional application No. 62/618,297, filed on Jan. 17, 2018.

(51) Int. Cl.
*G01V 3/00* (2006.01)
*G01N 24/00* (2006.01)
*G01Q 60/20* (2010.01)
*G02B 7/04* (2006.01)
(Continued)

(52) U.S. Cl.
CPC ........... *G01N 24/006* (2013.01); *G01Q 60/20* (2013.01); *G02B 7/04* (2013.01); *G01N 24/10* (2013.01); *G01R 33/323* (2013.01)

(58) Field of Classification Search
USPC ......................................................... 324/304
See application file for complete search history.

(56) References Cited

U.S. PATENT DOCUMENTS

2014/0231619 A1* 8/2014 Yamaguchi ........ G01N 21/6408
250/206.1
2018/0286074 A1* 10/2018 Lee ........................... G06T 7/74

OTHER PUBLICATIONS

Arai et al., "Fourier magnetic imaging with nanoscale resolution and compressed sensing speed-up using electronic spins in diamond." Nature nanotechnology 10.10 (2015): 859. 31 pages.
(Continued)

*Primary Examiner* — Walter L Lindsay, Jr.
*Assistant Examiner* — Frederick Wenderoth
(74) *Attorney, Agent, or Firm* — Smith Baluch LLP

(57) ABSTRACT

A method includes applying, to a sample exhibiting optical scattering and having a emission particles distributed therein that exhibit spin-dependent fluorescence, a magnetic field to shift a resonance frequency of each emission particle in a position-dependent manner. The method also includes exciting the sample with an excitation beam that causes at least one emission particle to emit spin-dependent fluorescence and detecting the emitted spin-dependent fluorescence. The method also includes estimating a position of the emission particle(s) within the sample based on the spin-dependent fluorescence, the resonance frequency, and the magnetic field. The method also includes estimating optical transmission information for the sample based on a wavefront of the excitation beam and the estimated position. The optical transmission information including a measure of an optical field at each position of an emission particle.

30 Claims, 11 Drawing Sheets

(51) Int. Cl.
*G01R 33/32* (2006.01)
*G01N 24/10* (2006.01)

(56) References Cited

OTHER PUBLICATIONS

Balasubramanian et al., "Nanoscale imaging magnetometry with diamond spins under ambient conditions." Nature 455.7213 (2008): 648. 5 pages.
Bernien et al., "Heralded entanglement between solid-state qubits separated by three metres." Nature 497.7447 (2013): 86.7 pages.
Chaigne et al., "Controlling light in scattering media non-invasively using the photoacoustic transmission matrix." Nature Photonics 8.1 (2014): 58. 18 pages.
Choi et al., "Overcoming the diffraction limit using multiple light scattering in a highly disordered medium." Physical review letters 107.2 (2011): 023902. 4 pages.
Choi et al., "Scanner-free and wide-field endoscopic imaging by using a single multimode optical fiber." Physical review letters 109.20 (2012): 203901. 5 pages.
Doherty et al., "The nitrogen-vacancy colour centre in diamond." Physics Reports 528.1 (2013): 1-45.
Dolde et al., "Room-temperature entanglement between single defect spins in diamond." Nature Physics 9.3 (2013): 139. 5 pages.
Dréau et al., "Avoiding power broadening in optically detected magnetic resonance of single NV defects for enhanced dc magnetic field sensitivity." Physical Review B 84.19 (2011): 195204.8 pages.
Emiliani et al., "Near-field short range correlation in optical waves transmitted through random media." Physical review letters 90.25 (2003): 250801. 4 pages.
Giovannetti et al., "Advances in quantum metrology." Nature photonics 5.4 (2011): 222.
Horstmeyer et al., "Guidestar-assisted wavefront-shaping methods for focusing light into biological tissue." Nature photonics 9.9 (2015): 563. 9 pages.
Jiang et al., "Repetitive readout of a single electronic spin via quantum logic with nuclear spin ancillae." Science 326.5950 (2009): 267-272.
Judkewitz et al., "Speckle-scale focusing in the diffusive regime with time reversal of variance-encoded light (TROVE)." Nature photonics 7.4 (2013): 300. 6 pages.
Kalb et al., "Entanglement distillation between solid-state quantum network nodes." Science 356.6341 (2017): 928-932.
Katz et al., "Noninvasive nonlinear focusing and imaging through strongly scattering turbid layers." Optica 1.3 (2014): 170-174.
Kucsko et al., "Nanometre-scale thermometry in a living cell." Nature 500.7460 (2013): 54. 6 pages.
Lai et al,. "Photoacoustically guided wavefront shaping for enhanced optical focusing in scattering media." Nature photonics 9.2 (2015): 126. 7 pages.

Ma et al., "Time-reversed adapted-perturbation (TRAP) optical focusing onto dynamic objects inside scattering media." Nature photonics 8.12 (2014): 931. 6 pages.
Maurer et al., "Far-field optical imaging and manipulation of individual spins with nanoscale resolution." Nature Physics 6.11 (2010): 912. 28 pages.
Maze et al., "Nanoscale magnetic sensing with an individual electronic spin in diamond." Nature 455.7213 (2008): 644. 9 pages.
Neumann et al., "Single-shot readout of a single nuclear spin." Science 329.5991 (2010): 542-544.
Park et al., "Full-field subwavelength imaging using a scattering superlens." Physical review letters 113.11 (2014): 113901. 5 pages.
Park et al., "Subwavelength light focusing using random nanoparticles." Nature photonics 7.6 (2013): 454. 5 pages.
Popoff et al., "Image transmission through an opaque material." Nature communications 1 (2010): 81.
Popoff et al., "Measuring the transmission matrix in optics: an approach to the study and control of light propagation in disordered media." Physical review letters 104.10 (2010): 100601. 4 pages.
Rittweger et al., "STED microscopy reveals crystal colour centres with nanometric resolution." Nature Photonics 3.3 (2009): 144. 4 pages.
Robledo et al., "High-fidelity projective read-out of a solid-state spin quantum register." Nature 477.7366 (2011): 574. 7 pages.
Ruan et al., "Optical focusing inside scattering media with time-reversed ultrasound microbubble encoded light." Nature communications 6 (2015): 8968. 8 pages.
Si et al., "Fluorescence imaging beyond the ballistic regime by ultrasound-pulse-guided digital phase conjugation." Nature photonics 6.10 (2012): 657. 5 pages.
Taminiau et al., "Universal control and error correction in multi-qubit spin registers in diamond." Nature nanotechnology 9.3 (2014): 171. 30 pages.
Van Putten et al., "Scattering lens resolves sub-100 nm structures with visible light." Physical review letters 106.19 (2011): 193905. 4 pages.
Vellekoop et al., "Demixing light paths inside disordered metamaterials." Optics express 16.1 (2008): 67-80.
Vellekoop et al., "Exploiting disorder for perfect focusing." Nature photonics 4.5 (2010): 320. 4 pages.
Vellekoop et al., "Focusing coherent light through opaque strongly scattering media." Optics letters 32.16 (2007): 2309-2311.
Waldherr et al., "Quantum error correction in a solid-state hybrid spin register." Nature 506.7487 (2014): 204. 10 pages.
Wang et al., "Deep-tissue focal fluorescence imaging with digitally time-reversed ultrasound-encoded light." Nature communications 3 (2012): 928. 8 pages.
Xu et al., "Time-reversed ultrasonically encoded optical focusing into scattering media." Nature photonics 5.3 (2011): 154. 4 pages.
Yao et al., "Scalable architecture for a room temperature solid-state quantum information processor." Nature communications 3 (2012): 800. 8 pages.

\* cited by examiner

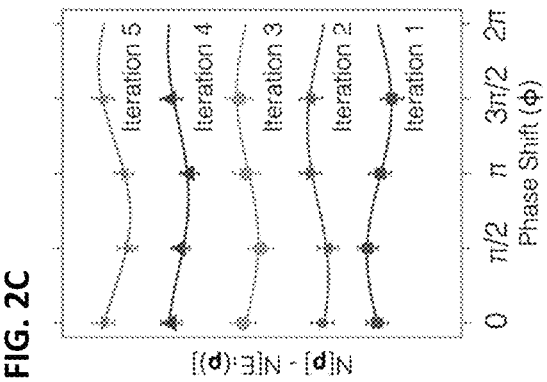
FIG. 2A
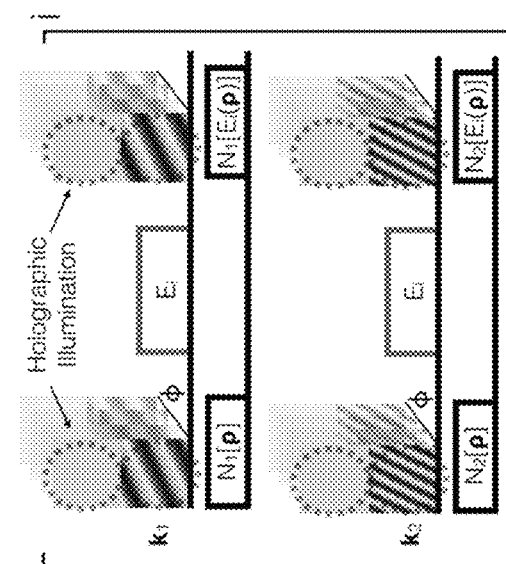
FIG. 2B
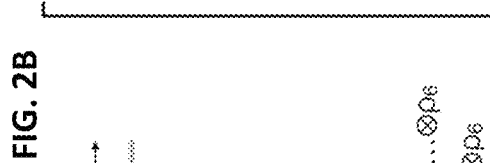
FIG. 2C
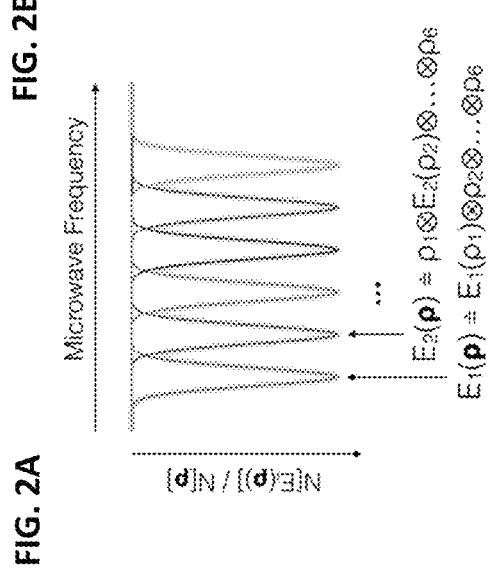
FIG. 2D
FIG. 2E
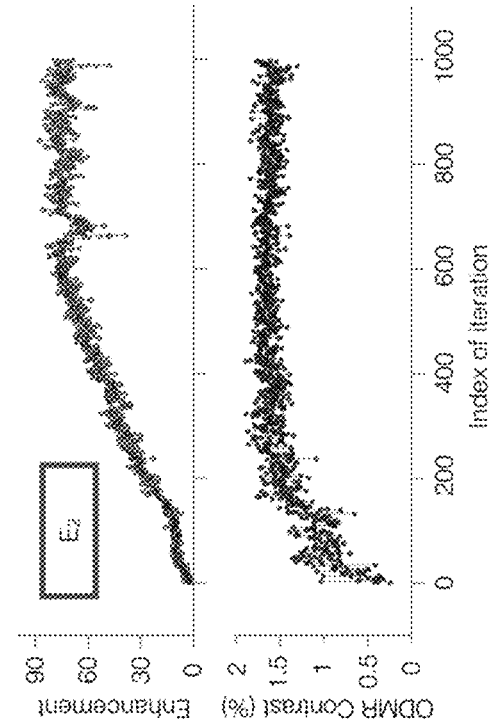
FIG. 2F
FIG. 2G

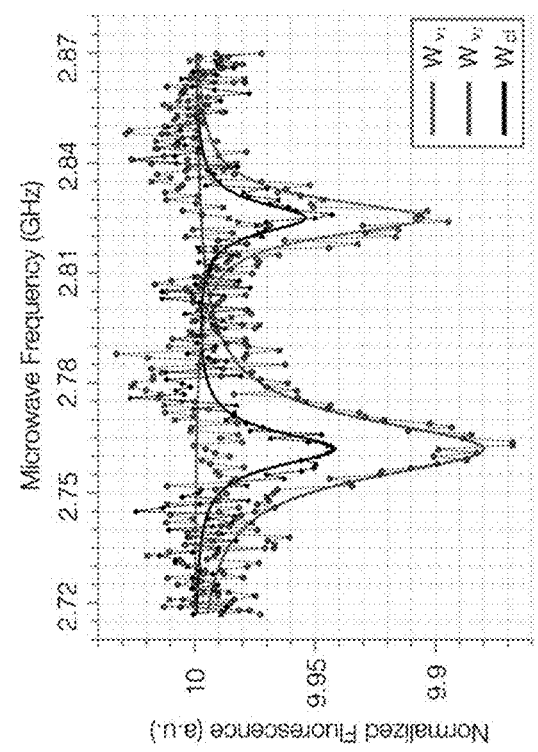
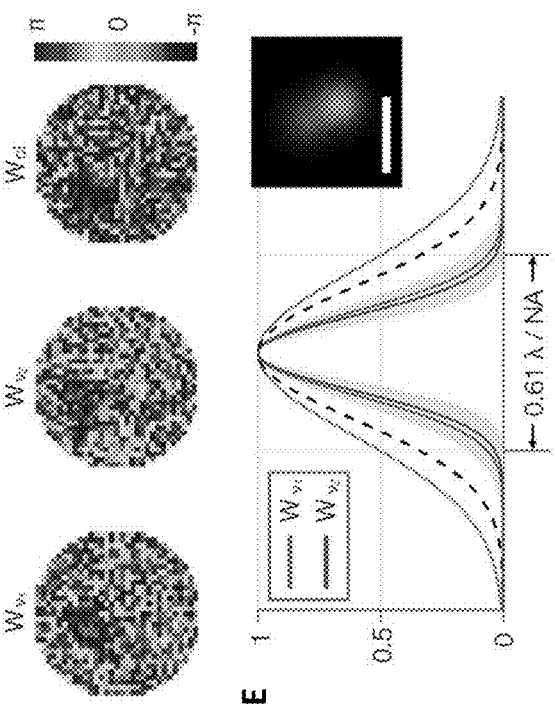
FIG. 4A    FIG. 4B    FIG. 4C    FIG. 4D
FIG. 4E

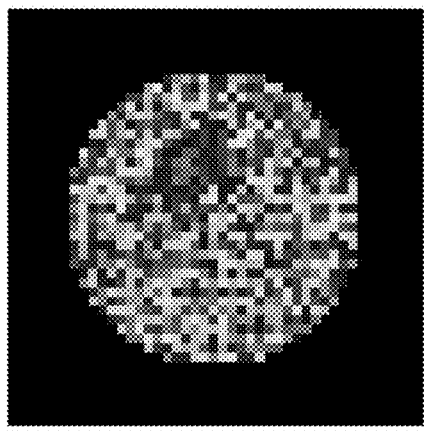
FIG. 6A
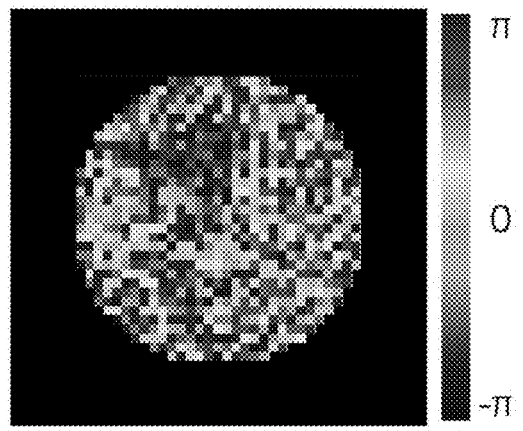
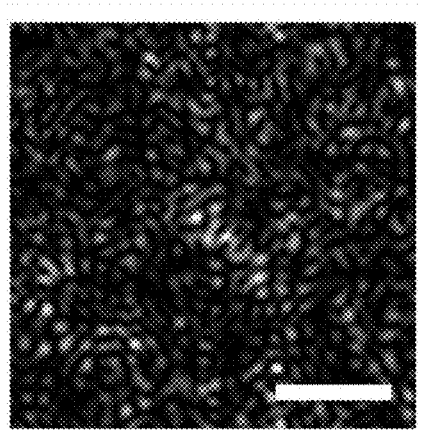
FIG. 6B
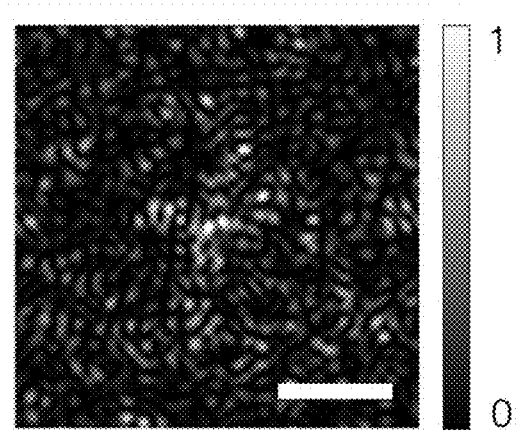
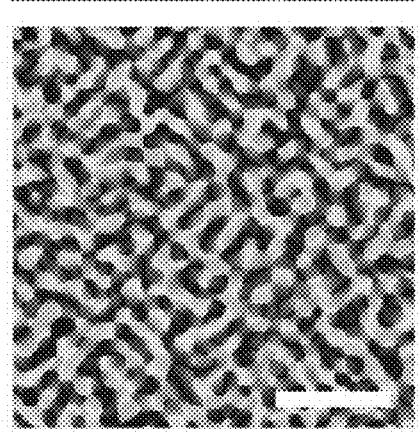
FIG. 6C
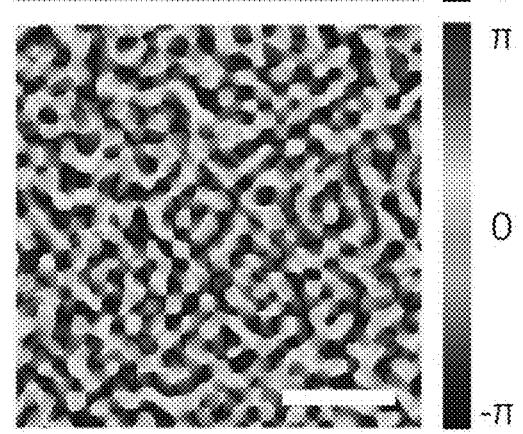

800

| Applying, to a sample exhibiting optical scattering and having a plurality of emission particles distributed therein that exhibit spin-dependent fluorescence, a magnetic field to shift a resonance frequency of each emission particle of the plurality of emission particles in a position-dependent manner<br>810 |

↓

| Exciting the sample with an excitation beam, such that the excitation beam causes at least one of the plurality of emission particles to emit spin-dependent fluorescence<br>820 |

↓

| Detecting the spin-dependent fluorescence emitted by at least one of the plurality of emission particles<br>830 |

↓

| Estimating a position of the at least one of the plurality of emission particles within the sample based on the spin-dependent fluorescence, the resonance frequency of the at least one of the plurality of emission particles, and the magnetic field<br>840 |

↓

| Estimating optical transmission information for the sample based on a wavefront of the excitation beam and the estimated position, the optical transmission information including a measure of an optical field at each position of an emission particle of the plurality of emission particles<br>850 |

FIG. 8

SYSTEMS, APPARATUSES, AND METHODS FOR OPTICAL FOCUSING IN SCATTERING SAMPLES

CROSS-REFERENCE TO RELATED APPLICATIONS

This application claims priority to U.S. Provisional Application No. 62/618,297 filed Jan. 17, 2018, titled "QUANTUM REFERENCE BEACON", the entire disclosure of which is hereby incorporated by reference.

STATEMENT OF GOVERNMENT SUPPORT

This invention was made with government support under Grant No. 134062-5093041 awarded by the Army Research Office. The government has certain rights in the invention.

BACKGROUND

Optical random scattering is generally considered to be a nuisance of microscopy that limits imaging depth and spatial resolution. Wavefront shaping techniques have recently enabled optical imaging at unprecedented depth, but a remaining problem is also to attain super-resolution within complex, scattering media.

SUMMARY

In some embodiments, a method includes applying, to a sample exhibiting optical scattering and having emission particles distributed therein that exhibit spin-dependent fluorescence, a magnetic field to shift a resonance frequency of each emission particle in a position-dependent manner. The method also includes exciting the sample with an excitation beam that causes at least one emission particle to emit spin-dependent fluorescence, and detecting the emitted spin-dependent fluorescence. The method also includes estimating a position of the emission particle(s) within the sample based on the spin-dependent fluorescence, the resonance frequency, and the magnetic field. The method also includes estimating optical transmission information for the sample based on a wavefront of the excitation beam and the estimated position. The optical transmission information including a measure of an optical field at each position of an emission particle.

In some embodiments, a system includes a magnet to apply, to a sample exhibiting optical scattering and having a plurality of emission particles distributed therein that exhibit spin-dependent fluorescence, a magnetic field to shift a resonance frequency of each emission particle of the plurality of emission particles in a position-dependent manner. The system also includes a microwave generator to generate and apply a microwave signal to the sample to modulate the spin state of at least one emission particle of the plurality of emission particles. The system also includes a light source to excite the sample with an excitation beam, such that the excitation beam causes at least one emission particle of the plurality of emission particles to emit spin-dependent fluorescence. The system also includes a detector to detect the spin-dependent fluorescence. The system further includes a controller to estimate a position of the at least one of the plurality of emission particles within the sample based on the spin-dependent fluorescence, the resonance frequency of the at least one of the plurality of emission particles, and the magnetic field. The controller also estimates optical transmission information for the sample based on a wavefront of the excitation beam and the estimated position. The optical transmission information includes a measure of an optical field at each position of an emission particle of the plurality of emission particles.

In some embodiments, a system includes a magnet, in electromagnetic communication with a sample exhibiting optical scattering and having a plurality of diamond nanoparticles distributed therein with nitrogen vacancy centers that exhibit spin-dependent fluorescence. The magnet applies a magnetic field having a gradient, such that the magnetic field shifts a resonance frequency of each nitrogen vacancy center in the plurality of diamond nanoparticles based on a position of that nitrogen vacancy center in the sample. The system also includes a light source to emit an excitation beam, and a wavefront shaping device, in optical communication with the light source and the sample, to excite the sample with the excitation beam. The excitation beam includes a set of basis modes, and the excitation beam causes at least one nitrogen vacancy center in the plurality of diamond nanoparticles to emit spin-dependent fluorescence. The system also includes a detector, in optical communication with the sample, to detect the spin-dependent fluorescence emitted by the sample. The system also includes a controller operably coupled to the detector and the wavefront shaping device. The controller estimate a position of the at least one nitrogen vacancy center in the plurality of diamond nanoparticles within the sample based on the spin-dependent fluorescence, the resonance frequency of the at least one nitrogen vacancy center in the plurality of diamond nanoparticles, and the magnetic field. The controller also generates an optical transmission matrix for the sample based on a wavefront of the excitation beam and the estimated position. The optical transmission matrix includes a measure of an optical field at a position of each nitrogen vacancy center in the plurality of diamond nanoparticles, and for each basis mode of the set of basis modes. The controller also estimates, for the position of each nitrogen vacancy center in the plurality of diamond nanoparticles and for each basis mode, a feedback parameter to generate a set of feedback parameters. The controller also actuates the wavefront shaping device to modify at least one characteristic of at least one basis mode of the excitation beam based on the set of feedback parameters.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 2A shows the different resonant frequencies of the QRBs based on fluorescence collection, where $\{\rho_i\}$ labels the electron spin states of QRBs, and an external magnetic field gradient splits their individual resonance frequencies. Quantum operators $\{E_i\}$ drive the electron spin transition of target QRBs.

FIG. 2B illustrates measurement sequences for the iterative wavefront optimization. The Fourier basis modes of the incident wavefront ($k_1$, $k_2$, . . . ) are encoded into holographic illuminations, in which the basis modes interfere with the reference plane wave for complex field readout. The overall fluorescence difference with $\{E_i\}$ (i.e., $N_j[\rho]-N_j[E_i(\rho)]$) produces the QRB-GS feedback $S_{i,j}$. $\phi$ describes the phase of each basis mode relative to the reference plane wave.

FIG. 2C illustrates modulation of the QRB-GS feedback in the iterative wavefront optimization. In each step, the phase $\phi$ of the basis modes is adjusted to compensate for the phase offset of the modulation.

FIGS. 2D, 2F illustrate iterative wavefront optimization with the QRB-GS feedback. Two QRBs have the electron spin resonance frequencies at $v_1=2.825$ GHz and $v_2=2.762$ GHz. The resonant microwaves continuously drive the resonances to produce the QRB-GS feedback, so that the incident optical fields can be iteratively updated to optimize the QRB-GS feedback signal strength at $v_1$ (FIG. 2D) and $v_2$ (FIG. 2F).

FIGS. 2E, 2G illustrate the ODMR contrast at $v_1$ (FIG. 2E) and $v_2$ (FIG. 2G) for the iterative optimization processes.

FIG. 4A illustrates the phase-only wavefront $W_{v1}$ determined by optimizing the QRB-GS feedback at $v_1$.

FIG. 4B illustrates the phase-only wavefront $W_{v2}$, determined by optimizing the QRB-GS feedback at $v_2$.

FIG. 4C illustrates the phase-only wavefront $W_{c1}$, obtained using the fluorescence GS method.

FIG. 4D illustrates ODMR spectra with $W_{v1}$, $W_{v2}$, and $W_{c1}$ projection.

FIG. 4E illustrates spatial resolution of the subwavelength foci in the complex medium. Two lines plot the estimated intensity shape of the subwavelength foci with $W_{v1}$ and $W_{v2}$ projection, respectively. The shaded area gives the estimation uncertainty. The other solid line plots the point spread function (PSF) of the excitation objective (FWHM=$0.61\lambda$/NA with $\lambda$=532 nm and NA=0.8), and the dashed line refers to the far-field limited PSF (NA=1). Inset: reconstructed image of the subwavelength foci with $W_{v1}$ and $W_{v2}$. Scale bar=$0.61\lambda$/NA with NA=0.8 and $\lambda$=532 nm.

FIG. 6A illustrates the phase maps of 793 incident basis modes, determined by the QRB-GS feedback. The DMD projects the phase maps into the back aperture of the excitation objective lens. Left (Right) plot is the result of the iterative optimization with the QRB-GS feedback at $v_1$ ($v_2$).

FIG. 6B, 6C illustrate the intensity (FIG. 6B) and phase map (FIG. 6C) of the incident wavefront on the complex medium, respectively. These maps are obtained by the Fourier transform of the phase maps plotted in FIG. 6A. (Scale bars=3 μm.)

FIG. 8 is a flow chart of a method for optical focusing, according to embodiments.

DETAILED DESCRIPTION

Figure 1A:
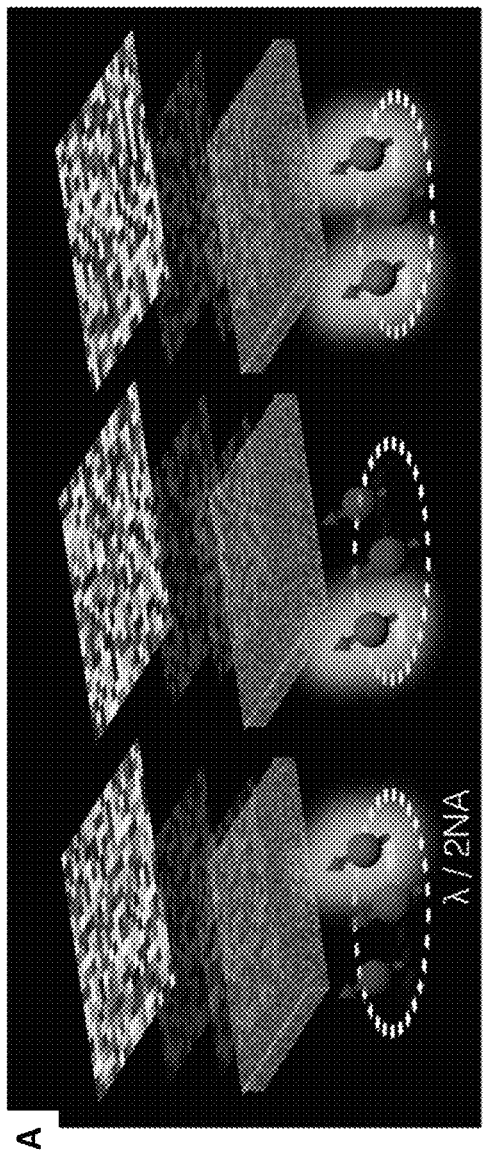
FIG. 1A illustrates how optical random scattering in complex media distorts the incident optical field. However, this distortion can be reversed by shaping the incident wavefront. Embedded quantum reference beacons (QRBs) provide feedback about subwavelength features of the scattered optical fields, guiding the wavefront shaping process. This approach enables, for example, super-resolution focusing deep inside of complex media or individual spin-qubit measurement in a diffraction-limited area (the dashed circle).

The concepts introduced above and discussed in greater detail below may be implemented in numerous ways. Examples of specific implementations and applications are provided primarily for illustrative purposes to enable those skilled in the art to practice the implementations and alternatives apparent to those skilled in the art.

The figures and example implementations described below are not meant to limit the scope of the present implementations to a single embodiment. Other implementations are possible by way of interchange of some or all of the described or illustrated elements. Moreover, where certain elements of the disclosed example implementations may be partially or fully implemented using known components, in some instances only those portions of such known components that are necessary for an understanding of the present implementations are described, and detailed descriptions of other portions of such known components are omitted so as not to obscure the present implementations.

Following below are more detailed descriptions of various concepts related to, and implementations of, optical focusing in scattering samples. In particular, disclosed herein is an example technique to focus inside of complex, scattering media by the use of a quantum reference beacon (QRB), which can include solid-state quantum emitters with spin-dependent fluorescence. This QRB provides subwavelength "guidestar" (described in more detail herein) feedback for wavefront shaping to achieve an optical focus below a microscope's diffraction limit. The QRB-guided imaging approach is implemented using nitrogen-vacancy centers in diamond nanocrystals (also sometimes referred to as nano-diamonds, diamond nanoparticles, nano-diamond particles, and variants thereof), which enable optical focusing with a sub-diffraction resolution below 186 nm (≈λ/=3.5NA), where the microscope's NA=0.8. This QRB-assisted wavefront shaping paves the way for a range of applications, including deep-tissue quantum enhanced sensing, and individual optical excitation of magnetically-coupled spin ensembles for applications in quantum information processing.

Optical random scattering in complex media, such as biological tissues, distorts an incident optical focus, reducing the resolution and imaging depth of optical microscopy. However, random scattering does not lead to the permanent loss of focusing capability; instead it randomizes the incident focus in a deterministic way. By reversing this scattering, it becomes possible to focus and even to image through complex media. Moreover, random scattering can actually benefit microscopy by permitting a spatial resolution below the diffraction-limit of λ/2NA, where NA is the numerical aperture of the microscope objective. This super-resolution is possible because random scattering couples optical modes with high in-plane momentum from the sample to the microscope objective, much like a disordered grating. By extending this principle to evanescent modes of the sample, far-field superlenses for near-field focusing and imaging have been achieved.

Reversing random scattering uses feedback from the target focal points. In particular, focusing light inside of complex media can use a type of "guidestar (GS)" that provides feedback of the interior optical field. This feedback guides incident wavefront adjustments to focus the scattered light into the GS point. In the last decade, various forms of GSs have been implemented, including fluorescence, ultrasound, nonlinear reference beacons, and kinetic objects. However, the spatial resolution using these types of GSs has been far from the super-resolution limit. To push this resolution to or below the diffraction limit can include two key advances: (i) the physical size of the GS should be of subwavelength scale, and (ii) it should be possible to resolve sub-diffraction features of randomly scattered light. A subwavelength aperture used in scanning near-field optical microscopy (SNOM) satisfies these conditions, but this technique does not permit imaging within a complex medium. To address these challenges, quantum reference beacons (QRBs) are introduced herein.

The QRB proposed herein includes solid-state quantum emitters with spin-dependent fluorescence. An example is the nitrogen vacancy (NV) center in diamond, which has emerged as a leading quantum system for quantum sensing and quantum information processing. By resonantly driving electron spin transitions of each QRB, the spin-dependent fluorescence produces the subwavelength GS feedback that enables super-resolution focusing within complex media. This proposal is demonstrated herein with ensembles of NV centers in subwavelength diamond nanocrystals, and show super-resolution focusing inside of a disordered scattering medium with a resolution below 186 nm (≈λ/3.5NA with λ=532 nm).

Figure 1C:
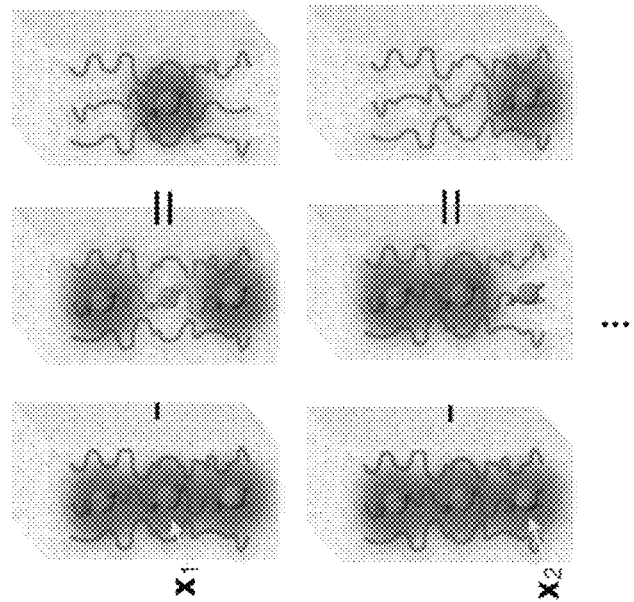
FIG. 1C illustrates the QRB-guide star (GS) feedback that is produced with the spin-dependent fluorescence. To measure the optical field on the QRB positioned at $x_1$, its fluorescence is selectively reduced by electron spin resonance (ESR). The change of collected fluorescence determines the optical field at $x_1$. This process can be repeated for another position at $x_2$ as shown in the bottom plot.
Figure 1B:
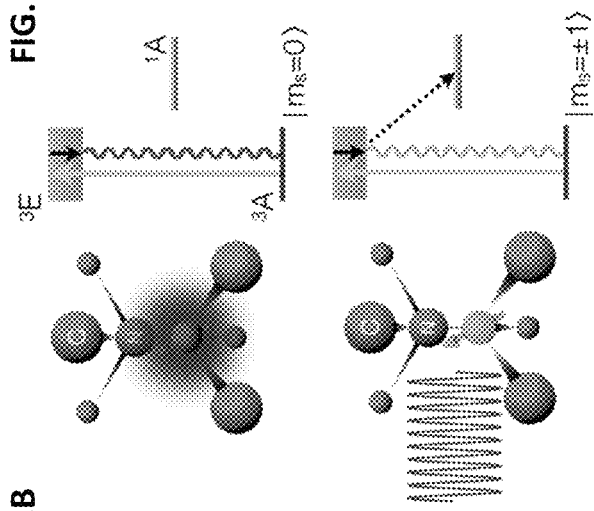
FIG. 1B illustrates nitrogen-vacancy (NV) centers in diamond with spin-dependent fluorescence. Electrons with the spin magnetic sublevels $|m_s=\pm1\rangle$ preferentially decay (dashed arrow) to the dark metastable state ($^1A$), once they are optically pumped to the excited states $^3E$ (arrow), resulting in reduced fluorescence than that from the sublevel $|m_s=0\rangle$. This spin-dependent fluorescence enables optically detectable magnetic resonance (ODMR).

FIGS. 1A-1C illustrate the approach to QRB-guided wavefront shaping in microscopy. A wavefront shaper adjusts basis modes (shown as individual pixels in FIG. 1A) of the incident wavefront to interfere scattered light constructively at target GS points. This specific wavefront adjustment is determined from the QRB-GS feedback. This feedback signal is created by applying a magnetic field gradient across the sample so that one of several QRBs inside a diffraction-limited volume can be selectively driven into its dark magnetic sublevels, as indicated in FIG. 1C and detailed below.

Specifically, the QRB-GS feedback signal is used to measure the transmission matrix that characterizes the light propagation through a complex medium, as discussed in more detail herein. The electron spin state of the embedded QRBs is labeled at $\{x_i\}=x_1, \ldots, x_N$ with a spin density operator $\rho=\rho_1 \otimes \rho_2 \otimes \ldots \otimes \rho_N$. An external magnetic field gradient separates their resonant frequencies $\{v_i\}$ by the Zeeman effect as shown in FIG. 1A. In principle, $\{x_i\}$ could then be reconstructed from $\{v_i\}$ and knowledge of the external magnetic field gradient. Resonant driving of each $\{\rho_i\}$ spin transition is represented through a quantum operator $\{E_i\}$. When the jth incident basis mode is coupled into the medium, the QRB-GS feedback $S_{i,j}$ for $x_i$ is described by $$S_{i,j}=N_j[\rho]-N_j[E_i(\rho)]=|t_{i,j}|^2 \Delta\sigma_i \Delta\gamma. \quad (1)$$

Here, $N_j[\rho]$ and $N_j[E_i(\rho)]$ denote the fluorescence photon numbers collected for unit integration, $t_{i,j}$ is the transmission matrix element (i.e., the scattered optical field at xi for the jth incident basis mode), $\Delta\sigma_i=\frac{1}{2}\mathrm{tr}[\sigma_z\{\rho_i-E_i(\rho_i)\}]$ where $\sigma_z$ is the Pauli-z operator, and $\Delta\gamma$ represents the variance of the collected spin-dependent fluorescence between the optically bright and dark spin states (FIG. 1B). FIGS. 2A-2G summarize the iterative wavefront adjustments due to the QRB-GS feedback.

The spatial resolution of the methods described herein can be determined by the ESR lineshape as detailed below, since the lineshape sets the point spread function (PSF) of the QRB-GS feedback that confines $\{E_i\}$ only to the target QRBs (FIG. 2A). Specifically, a magnetic field gradient dB/dx translates the (mean) resonance linewidth by to the spatial resolution $\Delta d_{QRB}$ of the effective PSF:

$$\Delta d_{QRB} = \frac{\delta v}{\gamma_e (dB/dx)} \quad (2)$$

where $\gamma_e$ is the gyromagnetic ratio of the electronic spin (~2.8 MHz/Gauss). Combined with the crystal orientation-dependent Zeeman splitting and dynamical decoupling to narrow the linewidth, this resolution can go down to a few tens of nanometers. Generally, the magnetic field gradient dB/dx can be based on the desired spatial resolution and the spin quality of QRB (i.e., linewidth of the magnetic resonance). Alternatively, if the QRBs within a diffraction-limited area have different orientation, orientation-dependent Zeeman splitting permits for splitting the resonance frequencies with a constant magnetic field.

Figure 3B:
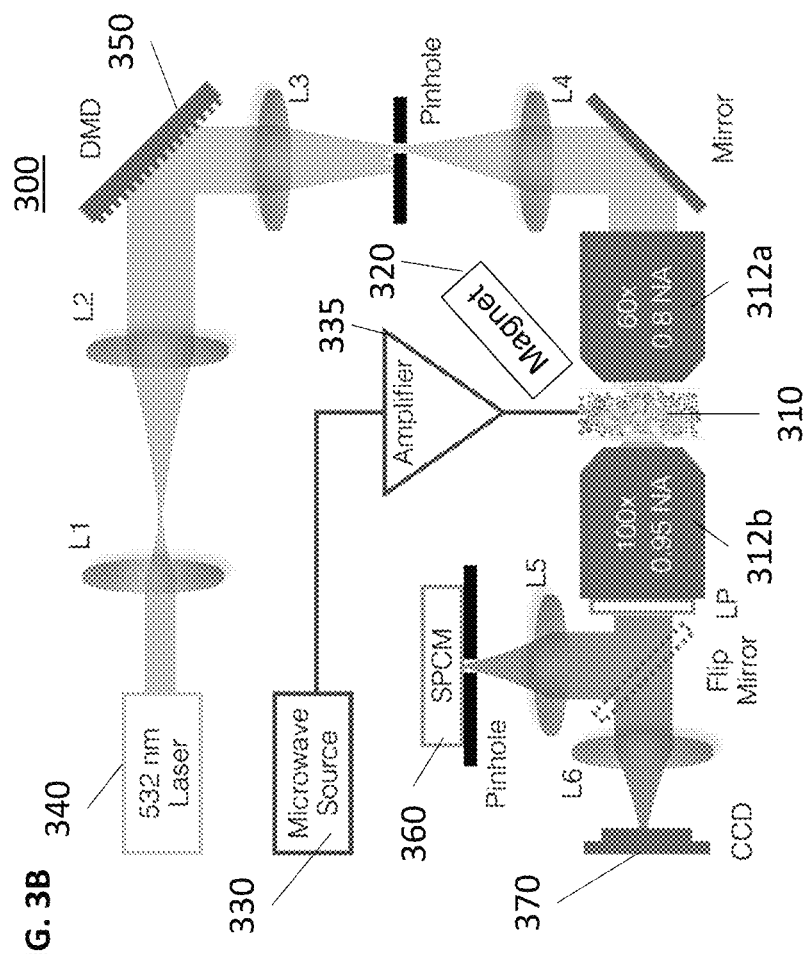
FIG. 3B illustrates an experimental setup. A digital micromirror device (DMD) shapes the wavefront of the incident green laser and projects it onto the back aperture of excitation objective. The phase of each incident basis mode $\{k_n\}$ is controlled by groups of 24 by 24 DMD micromirrors. SPCM (CCD) counts (images) the red fluorescence collected by the collection objective. LP rejects the transmitted green laser, and a pinhole in front of SPCM blocks stray red fluorescence. A copper wire (diameter of 25 μm) delivers the microwave signal, either directly or after amplification, to QRBs to modulate their spin ground state population. A permanent magnet separates the magnetic resonance frequencies of the QRBs by orientation-dependent Zeeman splitting. DMD: a digital micro-mirror device, SPCM: a single photon counting module, CCD: a charge-coupled device, LP: a long-pass optical filter with a cutoff wavelength of 650 nm, and L1-L6: lens.
Figure 3A:
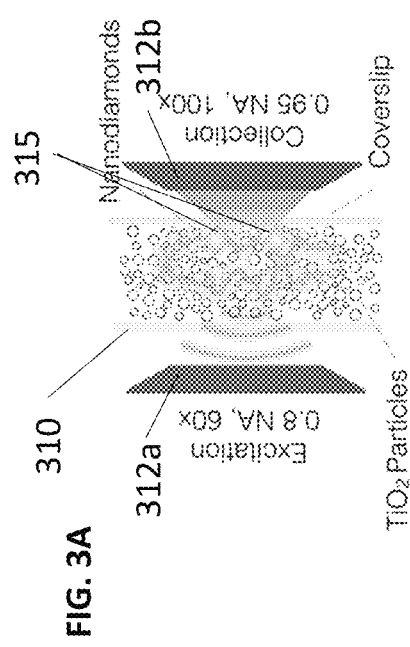
FIG. 3A illustrates NV centers in subwavelength nanodiamonds (Diamond Nanotechnologies) embedded in a complex medium including randomly distributed TiO2 nanoparticles (Sigma Aldrich 718467). A green laser beam is delivered to the complex medium by a microscope objective (0.8 NA, 60×). An objective (0.95 NA, 100×) at the other side directly collects spin-dependent broadband red fluorescence from NV centers. The thickness of the complex medium is ~7±2 μm.
Figure 3C:
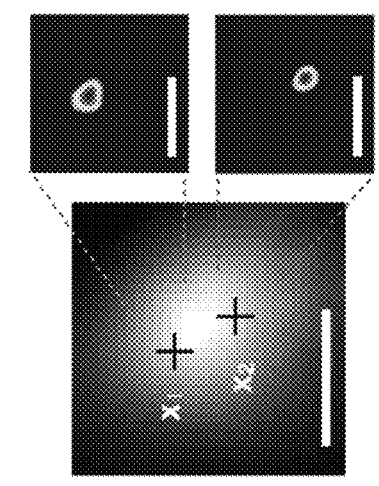
FIG. 3C illustrates QRB fluorescence images for super-resolution focusing demonstration. $x_1$ and $x_2$ denote the QRB positions. Inset images (large panel—fluorescence image of both QRBs without ESR, smaller panels—fluorescence images of individuals QRBs with ESR) are obtained using super-resolution focusing of the QRB-assisted wavefront shaping technique. All scale bars=$0.61\lambda$/NA with NA=0.8 and $\lambda$=532 nm.

FIGS. 3A-3C illustrate an experimental configuration/system for demonstrating QRB-assisted wavefront shaping. Generally, FIG. 3A illustrates a system 300 for optical focusing that includes a sample 310 having nanodiamonds 315 embedded therein (as best illustrated in FIG. 3A. While the sample 310 is illustrated herein as being an engineered sample that has randomly distributed $TiO_2$ nanoparticles to affect optical scattering, it is understood that any scattering sample can be used with the system 300, including naturally occurring materials, engineered materials, biological materials such as tissues, and combinations thereof. Additionally, while each QRB is illustrated herein as a nanodiamond (e.g, a diamond nanocrystal having a nitrogen vacancy color center), it can be any other suitable solid-state quantum emitter that exhibits spin-dependent fluorescence.

The system 300 includes a magnet 320 that applies a magnetic field to the sample 310 and establishes a gradient that shifts the resonant frequency of each nanodiamond 315 based on its position within the sample 310. The magnet 320 can be a permanent magnet (e.g., having a grade of N42 in some cases) having a fixed/constant vector magnetic field, or an electromagnet with a variable/tunable magnetic field. The magnet 320 can encompass a set of magnets, such that each magnet generates its own magnetic field along a different axis of the sample. In other instances, the magnet 320 can be movable around the sample to apply its magnetic field along different axes of the sample. For example, the magnet 320 can encompass multiple electromagnets aligned the X, Y, Z axes of the sample, with each electromagnet independently switched on and off to permit sequential application along the different axes.

The system 300 also includes a laser light source 340 to generate an excitation beam that can be applied to the sample 310. While illustrated herein as a laser operating at a wavelength of about 532 nm, the light source 340 can be any suitable source to induce fluorescence emission in the sample 310 (e.g., a laser, a lamp, light emitting diodes), and operating at any suitable wavelength/range, including between 200 nm-700 nm. The light source 340 is coupled to a wavefront shaping device, such as the digital micromirror device (DMD) 350, though it is understood that other suitable spatial light modulators, such as a magneto-optic spatial light modulators, can also be employed. The DMD 350 can be used to affect, at a per basis mode/per pixel level, modulation of one or more characteristics (e.g., phase, amplitude) of the excitation beam for iterative wavefront shaping as discussed in more detail herein. An excitation objective 312a (shown here as a 60×, 0.8 NA objective) couples the excitation beam to the sample 310, and an emission objective 312b (shown here as a 100×, 0.95 NA objective) receives the emission from the sample 310. It is understood that other specifications of magnification and numerical aperture are possible and independently selectable for the objectives 312a, 312b. Aspects of the system 300 are useful for super-resolution focusing, where the nanodiamonds 315 are separately detectable even when their separation is lower than the diffraction limit of the excitation objective 312a.

The excitation beam can include a reference part, or portion, or mode, and also include a set of spatial modes (also sometimes referred to as "basis modes"). The reference part can be coupled to the excitation objective 312a via a different optical path than the set of spatial modes. For example, in an example setup, a beam splitter splits the excitation beam into two separate beams, one of which is sent directly to the same as the reference beam, while the other is sent to the sample via scanning mirrors, an acousto-optic deflector, etc. as the set of spatial modes. It is the set of spatial modes that undergo optimization (e.g., of phase) based on the QRB-GS feedback. The resulting fluorescence, absorbance, and/or transmission resulting from the reference part provides an additional or alternative approach to estimating the optical transmission information.

The fluorescence emission can then be captured by a detector 360, shown here as a SPCM, which can include a photocathode, photoanode, a CCD-based sensor, a CMOS-based sensor, etc. The system 370 also includes an imaging device 370, shown here as a CCD camera, for capturing fluorescence images of the sample 310. During operation, the fluorescence signal, which represents spin-dependent fluorescence emanating from the nanodiamonds 315, can be used to estimate the location of the nanodiamonds 315, and which in turn can be used to estimate optical transmission (i.e., including scattering) characteristics of the sample 310. This optical transmission information, based on fluorescence from all the nanodiamonds 315 can be employed to focus the interior optical field and generate the wavefront $W_{cl}$ as explained herein.

To obtain super-resolution as described herein, the system 300 also includes a microwave generator 330 to generate a microwave signal having stable amplitude and phase, and an amplifier 335 (coupled thereto, though the amplifier, which can be a low-noise amplifier, can be optional. Generating the feedback signal (also sometimes referred to as a feedback parameter, or a set of feedback parameters) is done by applying the microwave signal to the sample 310 to selectively drive the spin transition of each nanodiamond 315 separately and sequentially. For example, the microwave signal can have a frequency that is resonant with just a first nanodiamond, resulting in a fluorescence response just from that nanodiamond, and (when provided as feedback to the DMD 350) resulting in a wavefront that is optimized for that nanodiamond. Then, the microwave signal can be reapplied at a frequency that is resonant with that of a second nanodiamond, and that fluorescence response/resulting wavefront is optimized for that naodiamond. FIG. 3C illustrates the fluorescence images of a) two such nanodiamonds when imaged using the light source 330 (large panel), and b) the same nanodiamonds when the microwave generator 330 and the DMD 350 are also employed as described herein, providing two separate fluorescence images, one or each nanodiamond (two smaller panels). In some embodiments, as described in greater detail with respect to FIGS. 5A-5B, the system 300 can encompass timing operations that coordinate operation of the microwave source 330 and the light source 340 (and/or the DMD 350) for fluorescence image collection for a particular nanodiamond.

In the specific configuration illustrated in FIGS. 3A-3C, the QRBs are ensembles of NV centers (FIG. 1B) in nanodiamonds with a mean diameter of 50 nm. The QRBs are embedded in a complex medium made of randomly distributed $TiO_2$ nanoparticles with a mean diameter of 21 nm. The incident green laser light ($\lambda$=532 nm) is randomly scattered as it propagates through the medium. This scattering produces subwavelength spatial features on the incident laser light, which excite the embedded QRBs. In particular, demonstrated herein is super-resolution focusing on two QRBs at $x_1$ ($QRB_1$) and $x_2$ ($QRB_2$) in FIG. 3C, where their separation $|x_1-x_2|$=186 nm is far below the diffraction limit of the excitation objective lens, 406 nm (FIGS. 7A-7D). The $QRB_1$ ($QRB_2$) has an ESR frequency of $v_1$=2.825 GHz ($v_2$=2.762 GHz), which corresponds to the electronic spin transition between $|m_s=0\rangle$ and one of the Zeeman split $|m_s=\pm 1\rangle$ of the ground spin triplet ($^3A$, FIG. 1B). Since $v_1$ and $v_2$ are well-separated ($\Delta v \approx 63$ MHz) compared to their resonance linewidths ($\delta v_1$=5 MHz and $\delta_2$=5.6 MHz), it is possible to individually drive the spin transition of each QRB.

In this study, the incident wavefront is shaped with 793 transverse Fourier basis modes $\{k_n\}$, which cover the entire back aperture of the excitation objective. Resonant microwaves drive the spin transitions at $v_1$ and $v_2$ that produce the QRB-GS feedback, and the phase of $\{k_n\}$ is iteratively adjusted to optimize the feedback signal (FIGS. 2D and 2F). FIGS. 4A, 4B plot the results of the wavefront optimizations $W_{v1}$ and $W_{v2}$, respectively. For comparison, FIG. 4C shows the wavefront $W_{cl}$, obtained without the use of ESR (i.e. by optimizing fluorescence feedback from QRBs). This fluorescence GS method focuses the interior optical field without achieving super-resolution.

Projecting the wavefronts $W_{v1}$ ($W_{v2}$) forms a superresolution optical focus at $x_1(x_2)$ in the complex medium. This super-resolution focusing can be verified by investigating optically-detectable-magnetic-resonance (ODMR) spectra. This is because (i) ODMR spectra exhibit resonances of optically pumped QRBs, and (ii) QRB1 and QRB2 have distinguishable spectra. FIG. 4D plots the ODMR spectra for this investigation. First, the wavefront $W_{cl}$ is projected with the DMD (FIG. 3B), which produces the ODMR spectrum as shown. This spectrum shows the resonances at $v_1$ and $v_2$ of both QRBs, as expected. By contrast, the resonance of $QRB_1$ appears when $W_{v1}$ is projected, which is obtained using the QRB-GS feedback with the spin transition at $v_1$. Alternatively, projecting $W_{v2}$ reveals the resonance of $QRB_2$. This demonstration validates the ability of QRB-guided wavefront shaping to enable optical addressing of individual spots far below the diffraction limit. Note that the resonance linewidths are slightly broadened when the QRBs are excited by the targeted subwavelength foci, owing to the optically induced relaxation of ODMR.

The ODMR spectra with subwavelength spin addressing enable us to estimate the spatial resolutions of the optical foci (FIG. 4E). The peak-to-background intensity ratio of the focus (i.e. $I(x_1)=I(x_2)$ or vice versa) is determined from the ODMR spectra, as detailed herein. Assuming the subwavelength focus features a Gaussian intensity envelope, the intensity ratio indicates that the super-resolution focus at $x_1$ ($x_2$) has a spatial resolution of 204 nm (184 nm). This achieved resolution is 2 (2.21) times smaller than the diffraction limited resolution and 1.31 (1.45) times smaller than the far-field-limited one (NA=1).

Figure 5A:
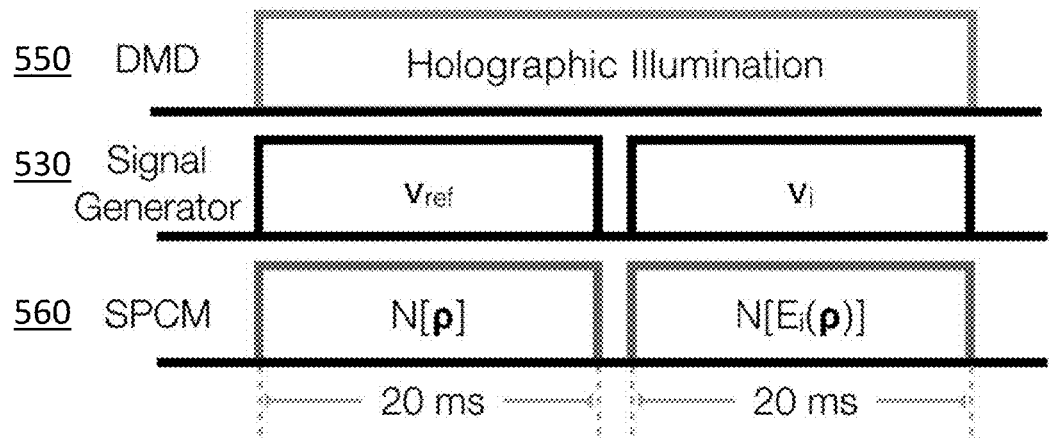
FIG. 5A illustrates modulating $\Delta\sigma_i$ of a target QRB with continuously-driven ESR. For a given holographic illumination, the microwave is continuously applied at the reference frequency of $v_{ref}$=2.5 GHz, which is far off from $v_1$=2.825 GHz and $v_2$=2.762 GHz, for 20 ms, and at the target resonance frequency $v_1$ or $v_2$ for another 20 ms. During the microwave operations, the spin-dependent fluorescence photon $N[\rho]$ and $N[E(\rho)]$ are simultaneously collected with a single photon counting module. This unit sequence is repeated for 300 times per a holographic illumination. A digital clock pulse train from a DAQ synchronizes the microwave operations and the photon collections.

FIG. 5A illustrates timing aspects of microwave generation via the microwave generator 530 (referred to here as a signal generator) and fluorescence collection via the SPCM 560. The sample is illuminated continuously for a 40 ms duration via excitation beam delivery from the DMD 550. During the first 20 seconds, the microwave generator 530 applies a frequency ($v_{ref}$) that is different than the resonant frequency of all nanodiamonds, and the SPCM 560 collects fluorescence photons N[ρ] that represent fluorescence from all nanodiamonds as a reference. During the next 20 seconds, the microwave generator 530 applies a frequency ($v_i$) that is the same as the resonant frequency of a target nanodiamond, and the SPCM 560 collects fluorescence photons $N[E_i(\rho)]$ that represents fluorescence from that target nanodiamond. A timing device, such as a digital acquisition (DAQ) circuit, can be used to control operation of the DMD 550, the signal generator 530, and the SPCM 560. The measurement can be repeated for each nanodiamond to improve signal-to-noise (SNR) of the measurement (e.g., repeated 10, 50, 100, 300, 500 times, etc.).

Figure 5B:
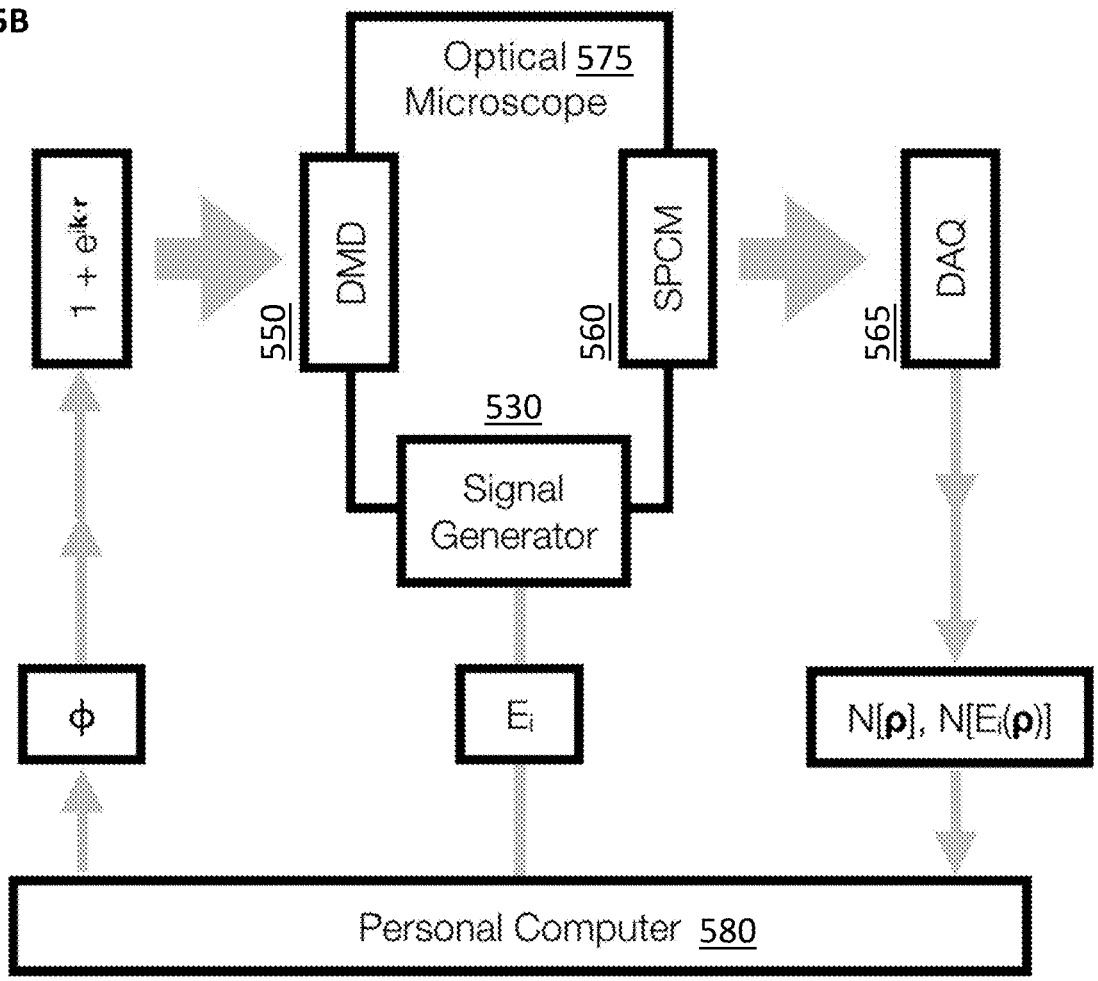
FIG. 5B illustrates how the DMD in the optical microscope projects the holographic illumination $1+e^{ik\cdot r}$ of the incident basis mode. Signal generator applies the quantum operator E to produce $\Delta\sigma_i$. SPCM counts the spin-dependent fluorescence photons, and DAQ returns the fluorescence measurement N[ρ], N[E(ρ)]. From the measurements, personal computer determines the phase φ to be compensated on the incident basis mode. Updating the phase φ to DMD closes the iterative wavefront optimization cycle. DMD: digital micromirror device (D4100, Digital Innovations), SPCM: single photon counting module (SPCM-AQ4C, Excelitas), DAQ: Multi-functional data acquisition (NI-6343, National Instrument), Signal Generator (SME Rohde & Schwarz).
Figure 7A:
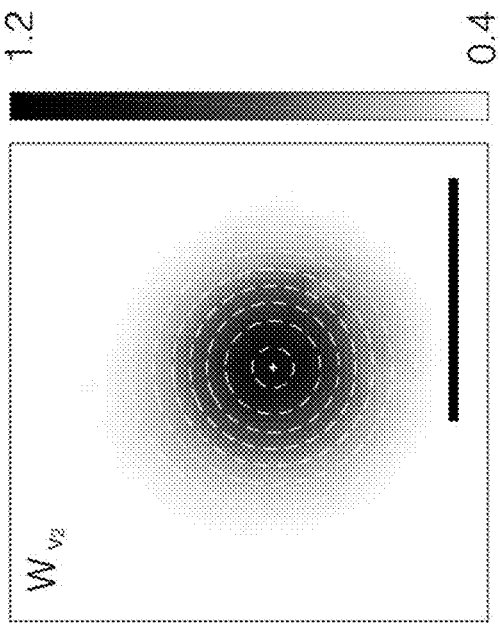
FIG. 7A, 7B illustrate individual excitation of $QRB_1$ (FIG. 7A) and $QRB_2$ (FIG. 7B) with subwavelength optical focus through a scattering medium. The central position $x_1$ and $x_2$ of QRB1 and QRB2 are localized by fitting the recorded fluorescence images into two-dimensional Gaussian functions. (Scale bar=1.22λ/NA≈810 nm.)
Figure 7B:
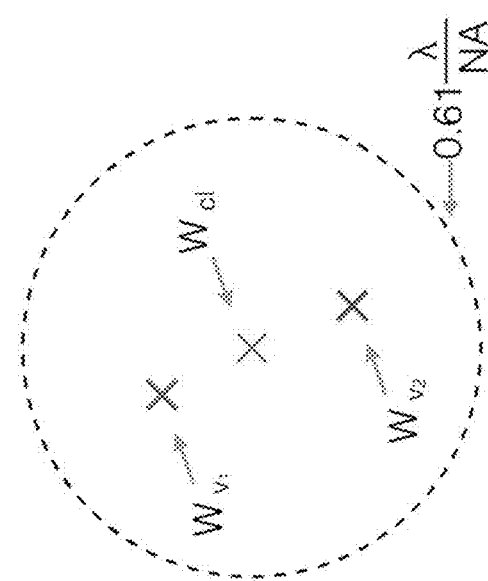
Figure 7C:
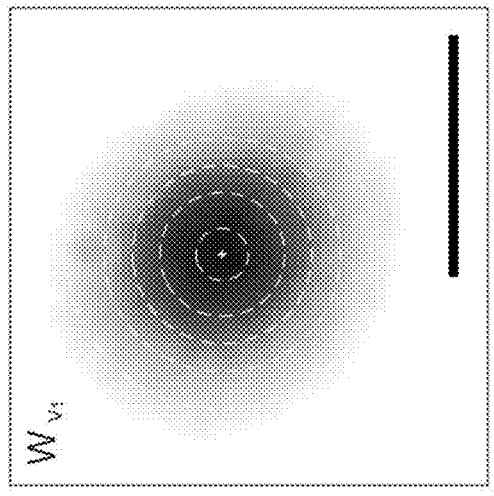
FIG. 7C illustrates the central position with the $W_{cl}$ projection for comparison.
Figure 7D:
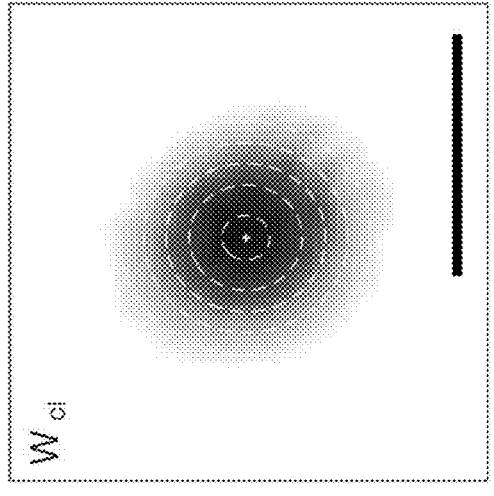
FIG. 7D illustrates merged positions from FIGS. 7A-7D. The dashed circle guides the diffraction-limited resolution of the excitation microscope objective (NA=0.8, λ=532 nm).

FIG. 5B illustrates how the fluorescence collection in FIG. 5A is used to iteratively modify the wavefront of the excitation beam/the holographic illumination, denoted here by $1+e^{ik \cdot r}$. The holographic illumination of each basis mode is applied to the sample (contained within the microscope 575) via the DMD 550, and the signal/microwave generator applies the microwave signal $E_i$. The fluorescence measurements N[ρ], N[E(ρ)] are used to update (by a personal computer 580, which can include a controller 980 as disclosed in FIG. 9) the phase φ of that hologram of the corresponding basis mode. This entire loop can be run iteratively until the QRB-GS signal, undergoing optimization, reaches a predetermined criterion, such as saturation for example.

These data show that a QRB enables super-resolution optical focusing within complex media. This QRB-GS approach uniquely provides, for the first time, sub-wavelength guidestar feedback inside a scattering medium by the use of spin coherence. Implementing this proposed approach with NV centers demonstrates clear super-resolution focusing capabilities inside of a complex medium. This QRB-assisted wavefront shaping opens up a range of applications. First, it can extend to quantum sensing based on NV centers to greater imaging depth and optical super-resolution. Second, it can be used to characterize the light propagation through a fiber for single-fiber endomicroscopy. Finally, our method could open up the way for subwavelength optical spin measurement of magnetic dipole-coupled quantum emitters, which is essential for advanced quantum sensing, quantum error correction, and room-temperature quantum computing.

Electronic Spin Resonance of Quantum Reference Beacons.

The quantum reference beacon (QRB) includes a solid-state quantum emitter with spin-dependent fluorescence. One example is a nitrogen-vacancy (NV) center in diamond, which has the electron spin magnetic sublevels $|m_s=\pm 1\rangle$ that are optically darker than $|m_s=0\rangle$. This spin-dependent fluorescence enables optical detection of magnetic resonance. The QRB-guidestar feedback is based on the optically detectable magnetic resonance (ODMR), in which the optical fields are read out at the resonance points inside of complex media. By driving the resonances of the QRBs, their spin populations are individually modulated below the optical diffraction-limited resolution, which produces the guidestar feedback for wavefront shaping. In the NV-based experiment, the resonance is driven between the bright $|m_s=0\rangle$ and one of the dark $|m_s=\pm 1\rangle$ of NV centers. In the following, the bright and dark spin state involved in the magnetic resonance are represented as $|0\rangle$ and $|1\rangle$, respectively, and denote a spin state of a QRB with a spin density operator $\rho$.

For QRB-assisted wavefront shaping, the evolution of $\rho$ is described by the master equation $$\frac{d\rho}{dt} = \frac{1}{i\hbar}[H,\rho] + \left\{\frac{d\rho}{dt}\right\}_{relax} \quad (3)$$

where H is a simple two-level spin Hamiltonian that describes the relevant interaction of QRB with a microwave:

$$H = \hbar\omega|1\rangle\langle 1| + \hbar\Omega \cos(\omega_{mw})(|0\rangle\langle 1| + |1\rangle\langle 0|).$$

Here, the energy splitting $\hbar\omega$ includes the zero-field splitting $D_{gs} \approx 2.87$ GHz and the electronic Zeeman splitting $\gamma_e B_{0z}$, where $\gamma_e = 2.8$ MHz/Gauss and $B_{0z}$ is a magnetic field along the symmetry axis of NV centers. $\omega_{mw}$ is a microwave frequency that drives the magnetic resonance with the Rabi frequency $\omega$.

The last term of the master equation Eq. (3) represents the spin relaxation due to the interaction with the QRB's environment. This relaxation process includes the intrinsic spin relaxation from magnetic dipolar interactions with a spin bath. In addition, optical excitation induces spin relaxation through (i) spin polarization via intersystem crossing (ISC) followed by non-radiative decay, and (ii) the decoherence with scattered photons. Typical values of the intrinsic and optically induced relaxation rates for NV centers can be found in A. Dreau et al.

Modulating the spin state $\rho$ with a resonant microwave produces the guidestar feedback (the QRB-GS feedback). The modulation is denoted through a quantum operator E that maps an initial spin state $\rho$ to the modulated state $E(\rho)$. In this experiment, $\rho$ is modulated by continuous ESR (electronic spin resonance) spectroscopy, in which $\rho$ and $E(\rho)$ are the steady-steady solutions of Eq. (3) under optical excitation. With the modulation, the change of the spin population $\Delta\sigma$ is $$\Delta\sigma = \frac{1}{2}tr[\sigma_z\{\rho - E(\rho)\}], \quad (4)$$

where $\sigma_z$ is the Pauli-z operator, and tr[.] is the trace operator. For example, $\Delta\sigma = \frac{1}{2}$ for continuously-driven ESR of an initially polarized spin (i.e. $\rho = |0\rangle\langle 0|$), and $\Delta\sigma = 1$ for an ideal spin flip with a microwave $\pi$-pulse. For the case that the microwave has a detuning $\delta$ from the spin resonance frequency, $\Delta\sigma$ is reduced by an ESR lineshape $g(\delta)$ with $g(0) = 1$:

$$\frac{1}{2}tr[\sigma_z\{\rho_\delta - E(\rho_\delta)\}] = g(\delta)\Delta\sigma. \quad (5)$$

Here, $\rho\delta$ refers to the spin state that is driven by the microwave with a detuning of. Although details of the lineshape function depend on the dominant broadening mechanisms, it is assumed here that $g(\delta)$ is a Gaussian-shape function with a full-width-at-half maximum (FWHM) linewidth of $\delta v$.

The QRB-Guidestar Feedback.

In this section, the QRB-GS feedback is formulated in detail. As detailed herein, $\rho = \rho_1 \otimes \ldots \otimes \rho_M$ labels the initial spin state of QRBs at positions of $x_1, \ldots, x_M$ inside of the complex medium. An external magnetic field gradient separates individual resonance frequencies $\{v_m\}$ of $\{\rho_m\}$ (m=1, 2, \ldots, M). $\{E_m\}$ resonantly modulate the spin density operators $\{\rho_m\}$ with lineshape functions $\{g_m\}$ and linewidths $\{\delta v_m\}$. In principle, $\{x_m\}$ could then be reconstructed from $\{v_m\}$ and knowledge of the external magnetic field.

Optical fields inside of the complex medium are described by a transmission matrix T. For example, the matrix element $t_{m,n}$ describes the optical field at $\{x_m\}$ when the nth incident basis mode couples into the medium, i.e., $|t_{m,n}|^2$ is the optical intensity that excites the QRB at $x_m$. The internal optical fields excite the embedded QRBs, which in turn emit spin-dependent broadband fluorescence. By driving the spin resonance of target QRBs, the spin-dependent fluorescence provides information of the transmission matrix elements.

Specifically, obtaining the QRB-GS feedback $S_{i,n}$ at $x_i$ for the nth incident basis mode proceeds as follow. First, the fluorescence photons of the initial spin state $\rho$ are collected with the basis mode. The photon numbers $N_n$ collected for unit integration time is:

$$N_n[\rho] = \sum_m^M |t_{m,n}|^2 \{\gamma_0 \sigma_{00}^m + \gamma_1 \sigma_{11}^m\}. \quad (6)$$

Here, $\gamma_0(\gamma_1)$ represents the collected spin-dependent photon numbers of $|0\rangle(\langle 1|)$ for unit excitation intensity. $\sigma_{00}^m$ and $\sigma_{11}^m$ account for the spin population (i.e.

$\sigma_{00}{}^m = <0|\rho_m|0>$, $\sigma_{11}{}^m = <1|\rho_m|1>$) of the QRBs. It is assumed that the photon collection are identical for all embedded QRBs.

Next, a microwave is applied that is resonant to the target ith-QRB and repeat the fluorescence photon collection. As introduced in Eq. (4) and (5), the microwave operation, which is represented through a quantum operator $E_i$, modulates the spin population by $\Delta\sigma_i$ for the target QRB and by $g_m(\delta_m{}^i)\Delta\sigma_m$ for the other 'background' mth-QRB, where $\delta_m{}^i = v_m - v_i$ (i.e. $\delta_i{}^i = 0$). Then the collected photon number $N_n$ is $$N_n[E_i(\rho)] = |t_{i,n}|^2 \{\gamma_0(\sigma_{00}^i - \Delta\sigma_i) + \gamma_1(\sigma_{11}^i + \Delta\sigma_i)\} + \sum_{m \neq i}^{M} |t_{m,n}|^2 \{\gamma_0(\sigma_{00}^m - g_m(\delta_m^i)\Delta\sigma_m) + \gamma_1(\sigma_{11}^m + g_m(\delta_m^i)\Delta\sigma_m)\}. \quad (7)$$

By subtracting Eq. (7) from (6), $$N_n[\rho] - N_n[E_i(\rho)] = \quad (8)$$

$$|t_{i,n}|^2 \Delta\sigma_i(\gamma_0 - \gamma_1) + \sum_{m \neq i}^{M} |t_{m,n}|^2 g_m(\delta_m^i)\Delta\sigma_m(\gamma_0 - \gamma_1).$$

If $\delta_m{}^i \geq \delta v_m$ for all $m \neq i$, the contribution from the background QRBs is ignorable, reducing Eq. (8) to the desirable QRB-GS feedback at $x_i$:

$$S_{i,n} = N_n[\rho] - N_n[E_i(\rho)] = |t_{i,n}|^2 \Delta\sigma_i(\gamma_0 - \gamma_1). \quad (9)$$

The condition $\delta_m{}^i \geq \delta v_m$ determines our spatial resolution of the QRB-GS feedback, with an analogous to Rayleigh resolution limit in conventional optical microscopy. For a given external magnetic field gradient dB/dx, the ESR lineshape $g(\delta_m{}^i)$ is translated to an effective point spread function (PSF) of the QRB-GS feedback. Thus, our spatial resolution $\Delta d_{QRB}$ is given by the FWHM resolution of the effective PSF:

$$\Delta d_{QRB} = \frac{\delta v}{\gamma_e (dB/dx)}.$$

Here, $\delta v$ is the mean ESR linewidth of QRBs $$\left( \text{i.e., } \frac{1}{M} \sum_{m=1}^{M} \delta v_m \right).$$

This spatial resolution can be improved by introducing assumptions such as $\Delta\sigma_1 = \Delta\sigma_2 = \ldots = \sigma_M$. This resolution improvement depends on the accuracy of the assumptions and the signal-to-noise ratio of the measurements as in conventional optical microscopy.

Noise Estimation.

The noise in the QRB-GS feedback can be modeled with the photon shot noise of spin-dependent fluorescence. For the QRB-GS feedback $$S_{i,n} = N_n[\rho] - N_n[E(\rho)] = |t_{i,n}|^2 \Delta\sigma_i(\gamma_0 - \gamma_1), \quad (9)$$

consider the photon shot noise in $N_n[\rho]$ and $N_n[E(\rho)]$:

$$|t_{i,n}|\sqrt{\gamma_0 \sigma_{00}^i + \gamma_1 \sigma_{11}^i}$$

$$|t_{i,n}|\sqrt{\gamma_0 \sigma_{00}^i - \Delta\sigma_i) + \gamma_1(\sigma_{11}^i + \Delta\sigma_i)}$$

$$\Sigma_{m \neq i}^{M} |t_{m,n}|\sqrt{\gamma_0 \sigma_{00}^m + \gamma_1 \sigma_{11}^m}$$

$$\Sigma_{m \neq i}^{M} |t_{m,n}| \times \sqrt{\gamma_0 \{\sigma_{00}^m - g_m(\delta_m^i)\Delta\sigma_m\} + \gamma_1 \{\sigma_{11}^m + g_m(\delta_m^i)\Delta\sigma_m\}}$$

Assuming that the complex medium is in a lossless waveguide whose cross-section area is A, the noise $N_{i,n}$ to signal Eq. (9) ratio is $$\frac{N_{i,n}}{S_{i,n}} = \frac{\sum_m |t_{m,n}|\sqrt{1 - \sigma_{11}^m C}}{|t_{i,n}|^2 \Delta\sigma_i \sqrt{\gamma_0} C} \times \left[1 + \sqrt{1 - \frac{\Delta\sigma_m g_m(\delta_m^i) C}{1 - \sigma_{11}^m C}}\right]$$

$$\simeq \frac{\sum_m |t_{m,n}|\sqrt{1 - \sigma_{11}^m C}}{|t_{i,n}|^2 \Delta\sigma_i \sqrt{\gamma_0} C} \times \left[2 - \frac{\Delta\sigma_m g_m(\delta_m^i) C}{2(1 - \sigma_{11}^m C)}\right]$$

$$\lesssim \frac{2 \sum_m |t_{m,n}|}{|t_{i,n}|^2 \Delta\sigma_i \sqrt{\gamma_0} C}$$

$$\simeq \frac{2M \sqrt{(a/A)T}}{(a/A)T \Delta\sigma_i \sqrt{\gamma_0} C}$$

$$= \frac{2M}{\sqrt{\gamma_0 \tilde{a} T} \Delta\sigma_i C}.$$

Here, $$\sum_{m=1}^{M} |t_{m,n}|^2 = (a/A)T \doteq \tilde{a}T$$

where a is the cross-sectional area of QRBs, $C = 1 - \gamma_1/\gamma_0$, and T is the total transmission of the complex medium. As expected, the noise-to-signal ratio approaches to zero for a longer integration.

Four-Phase Method with the QRB-GS Feedback.

To access the phase of the transmission matrix element $t_{m,n}$, the incident Fourier basis modes $\{k_n\}$ are encoded into the holographic illuminations by interfering themselves with the reference mode $u_{ref}$. Specifically, the holographic illumination of a incident basis mode $k_n$ is represented by $$E_n^{in}(\phi) = 1 + e^{i(k_n \cdot r + \phi)}, \quad (10)$$

where $u_{ref} = 1$, and $\phi$ is the phase of the basis mode relative to the reference mode. When $E_n^{in}(\phi)$ couples to the complex medium, the scattered optical field on the ith QRB is $$E_{i,n}^{out}(\phi) = TE_n^{in} = t_{i,R} + t_{i,n} e^{i\phi}$$

$$= t_{i,R}\left(1 + \frac{t_{i,n}}{t_{i,R}} e^{i\phi}\right)$$

$$= 1 + t_{i,n} e^{i\phi},$$

$t_{i,R}$ is substituted for 1 without loss of generality. This leads the QRB-GS feedback $S_{i,n}(\phi)$:

$$S_{i,n}(\phi) = |E_{i,n}^{out}(\phi)|^2 \times \Delta\sigma_i(\gamma_0 - \gamma_1)$$

$$= [1 + t_{i,n}^2 + 2|t_{i,n}|\cos(\phi + \arg(t_{i,n}))] \times \Delta\sigma_i(\gamma_0 - \gamma_1).$$

By measuring the QRB-GS feedback with the four phase shifts φ=0, π/2, π, and 3π/2, the phase of the matrix element is reconstructed by $$\arg(t_{i,n}) = \arg\left[\frac{S_{i,n}(0) - S_{i,n}(\pi)}{4} + i\frac{S_{i,n}(3\pi/2) - S_{i,n}(\pi/2)}{4}\right].$$

Phase Readout with Continuously-Driven ESR.

The phase of the transmission matrix element is determined by sinusoidally modulating the optical excitation, as the phase of the incident basis modes is swept relative to the reference mode. In the meantime, $\Delta\sigma$ with continuously-driven ESR depends on the optical excitation, since the steady-steady solutions $\rho$ and $E(\rho)$ of Eq. (3) are a function of optical pumping. This dependence produces non-linearity of the four-phase shift measurement with the QRB-GS feedback. In this section, it is shown that the small variation of $\Delta\sigma$ does not affect on the phase readout in our measurement up to the first order. For the holographic illumination $\tilde{E}_n^{in} = 1 + e^{i(k_n \cdot r + \Phi)}$, the optical excitation $I_{i,n}(\phi)$ on the ith QRB is $$I_{i,n}(\phi) = |E_{i,n}^{out}(\phi)|^2 = 1 + t_{i,n}^2 + 2t_{i,n}\cos(\phi + \theta_{i,n})$$

where $\arg(t_{i,n})$ is substituted to $\theta_{i,n}$. The small variation of $\Delta\sigma$ is introduced up to the first order, while the phase φ of the holographic illumination is modulated:

$$\Delta\sigma_i(\phi) \cong \Delta\sigma_i^{(0)} + \Delta\sigma_i^{(1)}(\phi)$$

where $$\Delta\sigma_i^{(0)} = \Delta\sigma_i\bigg|_{I_{i,n}(0)} - I_{i,n}(0)\frac{d\Delta\sigma_i}{dI}\bigg|_{I_{i,n}(0)}$$

$$\Delta\sigma_i^{(1)}(\phi) = I_{i,n}(\phi)\frac{d\Delta\sigma_i}{dI}\bigg|_{I_{i,n}(0)}.$$

The corresponding QRB-GS feedback is $$S_{i,n}(\phi) = I_{i,n}(\phi)\Delta\sigma_i(\phi)(\gamma_0 - \gamma_1)$$

$$= I_{i,n}(\phi)[\Delta\sigma_i^{(0)} + \Delta\sigma_i^{(1)}(\phi)](\gamma_0 - \gamma_1)$$

$$= S_{i,n}^{(0)}(\phi) + S_{i,n}^{(1)}(\phi),$$

where $$S_{i,n}^{(0)}(\phi) = (\gamma_0 - \gamma_1)\Delta\sigma_i^{(0)} I_{i,n}(\phi)$$

$$\doteq \alpha_{i,n}^{(0)} + \alpha_{i,n}^{(1)}\cos(\phi + \theta_{i,n})$$

$$S_{i,n}^{(1)}(\phi) = (\gamma_0 - \gamma_1)I_{i,n}(\phi)^2 \frac{d\Delta\sigma_i}{dI}\bigg|_{I_{i,n}(0)}$$

$$\doteq \beta_{i,n}^{(0)} + \beta_{i,n}^{(1)}\cos(\phi + \theta_{i,n}) + \beta_{i,n}^{(2)}\cos^2(\phi + \theta_{i,n}).$$

Since $\cos^2(\theta_{i,n} + \pi) = \cos^2\theta_{i,n}$, and $\cos^2(\theta_{i,n} + 3\pi/2) = \cos^2(\theta_{i,n} + \pi/2)$, the nonlinear dependence in the four-phase measurement is cancelled out, resulting in $$\arg\left[\frac{S_{i,n}(0) - S_{i,n}(\pi)}{4} + i\frac{S_{i,n}(3\pi/2) - S_{i,n}(\pi/2)}{4}\right] =$$

$$\arg\left[\frac{\alpha_{i,n}^{(1)} + \beta_{i,n}^{(1)}}{2}(\cos\theta_{i,n} + i\sin\theta_{i,n})\right] = \arg(t_{i,n}).$$

Estimation of Spatial Resolution.

Described herein is how to estimate the spatial resolution of achieved subwavelength foci. Here, it is assumed that the target $QRB_1$ and $QRB_2$ are point-like particles localized at $x_1$ and $x_2$, respectively. In continuously-driven ESR spectroscopy, the spin density operators $\rho_1$ and $\rho_2$ are optically polarized into $|0\rangle\langle 0|$ when the microwave frequency $v_{off}$ is far off from their resonance frequencies, $v_1$ and $v_2$. By contrast, when the microwave is on resonances with $v_1$ and $v_2$, $\rho_1$ and $\rho_2$ become $(1-\Delta\sigma)|0\rangle\langle 0| + \Delta\sigma|1\rangle\langle 1|$ with $\Delta\sigma = \frac{1}{2}$, provided that the QRBs are not optically saturated.

In this analysis, $I_1^{(1)}$ and $I_2^{(1)}$ ($I_1^{(2)}$ and $I_2^{(2)}$) is denoted as the optical excitation at $x_1$ and $x_2$ when the wavefront $W_{v1}$ ($W_{v2}$) is projected. $N^{(1)}(v)$ ($N^{(2)}(v)$) is the corresponding ODMR spectra with $W_{v1}/(W_{v2})$ projection. To estimate the spatial resolution $\Delta r^{(1)}$ of the subwavelength focus at $x_1$ with $W_{v1}$ projection, consider the relations, $$N^{(1)}(v_{off}) = I_1^{(1)}\gamma_0 + I_2^{(1)}p\gamma_0 \quad (11)$$

$$N^{(1)}(v_1) = I_1^{(1)}[\gamma_0(1-\Delta\sigma) + \gamma_1\Delta\sigma] + I_2^{(1)}p\gamma_0 \quad (12)$$

$$= I_1^{(1)}\left(\gamma_0 - \frac{\Delta\gamma}{2}\right) + I_2^{(1)}p\gamma_0$$

$$N^{(1)}(v_2) = I_1^{(1)}\gamma_0 + I_2^{(1)}p[\gamma_0(1-\Delta\sigma) + \gamma_1\Delta\sigma] \quad (13)$$

$$= I_1^{(1)}\gamma_0 + I_2^{(1)}p\left(\gamma_0 - \frac{\Delta\gamma}{2}\right).$$

Here, $\Delta\gamma = \gamma_0 - \gamma_1$, and the parameter p takes account of the NV density difference between the two QRBs. p can be determined from ODMR $N^{(cl)}(v)$ under the diffraction-limited excitation, in which the optical excitations at $x_1$ and $x_2$ are approximately equal:

$$p = \frac{N^{(cl)}(v_{off}) - N^{(cl)}(v_2)}{N^{(cl)}(v_{off}) - N^{(cl)}(v_1)}. \quad (14)$$

In this experiment, p is determined with $W_{cl}$ projection.

From the ODMR spectra plotted in FIG. 4D the ODMR is obtained at $v_{off}$, $v_1$, and $v_2$ by fitting to the Lorentzian lineshape function:

$N^{(1)}(v_1)/N^{(1)}(v_{off}) = 0.9902(0.9891, 0.9912)$ $N^{(1)}(v_2)/N^{(1)}(v_{off}) = 0.9988(0.9976, 0.9999)$ $N^{(2)}(v_1)/N^{(2)}(v_{off}) = 0.9994(0.9985, 1.0004)$ $N^{(2)}(v_2)/N^{(2)}(v_{off}) = 0.9878(0.9870, 0.9885)$ $N^{(cl)}(v_1)/N^{(cl)}(v_{off}) = 0.9954(0.9943, 0.9965)$ $N^{(cl)}(v_2)/N^{(cl)}(v_{off}) = 0.9942(0.9932, 0.9952),$ where the values in the parenthesis represent 95% confidence bound of the fitting. By inserting the fit values to Eq. (11-14), it was found $I_1^{(1)}/I_2^{(1)} \approx 10.1$ and $p \approx 1.261$. Similarly, $I_2^{(2)}/I_1^{(2)} \approx 17.1$. Assuming subwavelength focus features a Gaussian intensity shape, its spatial resolution $\Delta r^{(1)}$ and $\Delta r^{(2)}$ are the FWHM of the intensity shapes:

$$\Delta r^{(1)} = 2\sqrt{\frac{\ln 2}{\ln(I_1^{(1)}/I_2^{(1)})}} \Delta x \simeq 204 \text{ nm}$$

$$\Delta r^{(2)} = 2\sqrt{\frac{\ln 2}{\ln(I_2^{(2)}/I_1^{(2)})}} \Delta x \simeq 184 \text{ nm,}$$

where $\Delta x = |x_1 - x_2| = 186$ nm (FIGS. 7A-7D). The uncertainties of the estimations are plotted in FIG. 4E.

FIG. 8 illustrates a method 800 for optical focusing, according to embodiments. Aspects of the method can encompass the approaches outlines for FIGS. 1-7 above and can be executed at least in part by the systems 300, 900 as illustrated in FIGS. 3A-3C, FIG. 9, respectively.

The method 800 can include, at 810, applying a magnetic field to a sample that exhibits optical scattering. The sample can have multiple emission particles (QRBs) distributed therein that exhibit spin-dependent fluorescence. The magnetic field shifts a resonance frequency of each emission particle in a position-dependent manner. In some embodiments, the magnetic field has a gradient. In some embodiments, the magnetic field has a constant magnitude (e.g., constant peak magnitude) as well as a constant gradient, such that the magnetic field shifts the resonance frequency of each emission particle based on both its position and orientation.

Figure 3D:
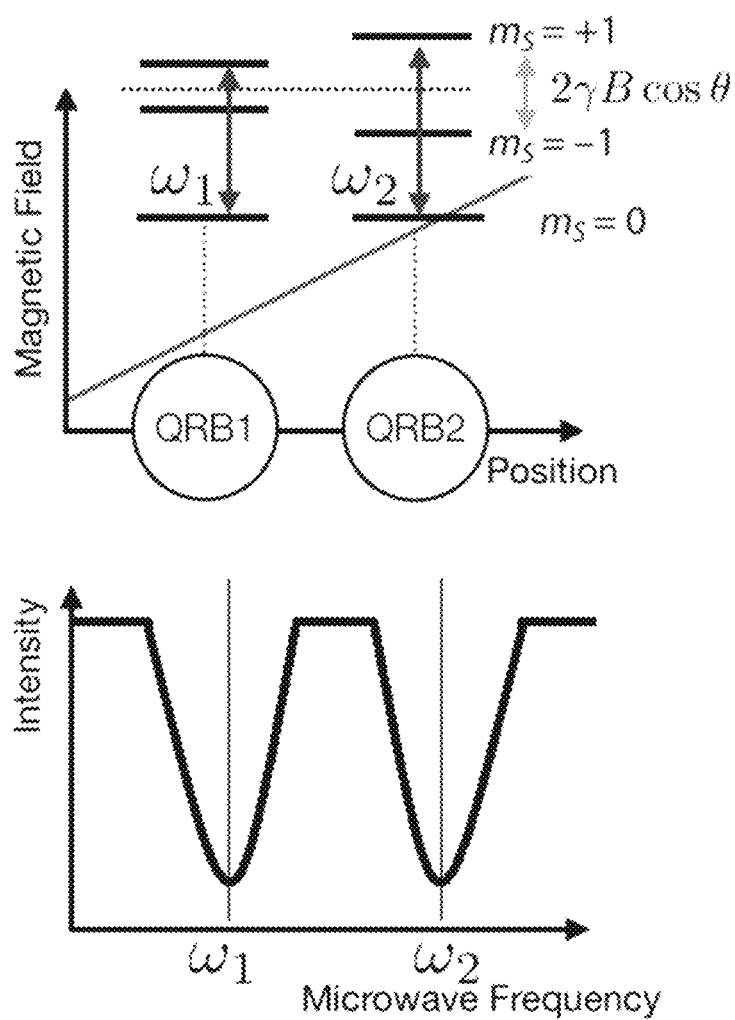
FIG. 3D, top panel illustrates how an external magnetic field gradient induces an energy shift in ground spin state in two QRBs at different positions based on the Zeeman effect. The bottom panel illustrates how the energy shift, and corresponding magnetic resonance, can be optically detected by spin-dependent fluorescence and application of a microwave signal.

The method 800 can further includes estimating the position and/or orientation of the emission particle(s) along two or more axes. For example, as also illustrated in FIG. 3D for a single axis, the magnetic field can be first applied along a first axis of the sample (e.g., an X-axis, for simplicity of explanation), and the position/orientation of the particle along that axis is estimated. This step can then be repeated along a second axis different from the first axis (e.g., a Y-axis, that can be orthogonal to the first axis), along a third axis (e.g., a Z-axis, that can be orthogonal to the first axis and the second axis), and so on, to estimate a position/orientation of the particles in three dimensions.

Figure 10:
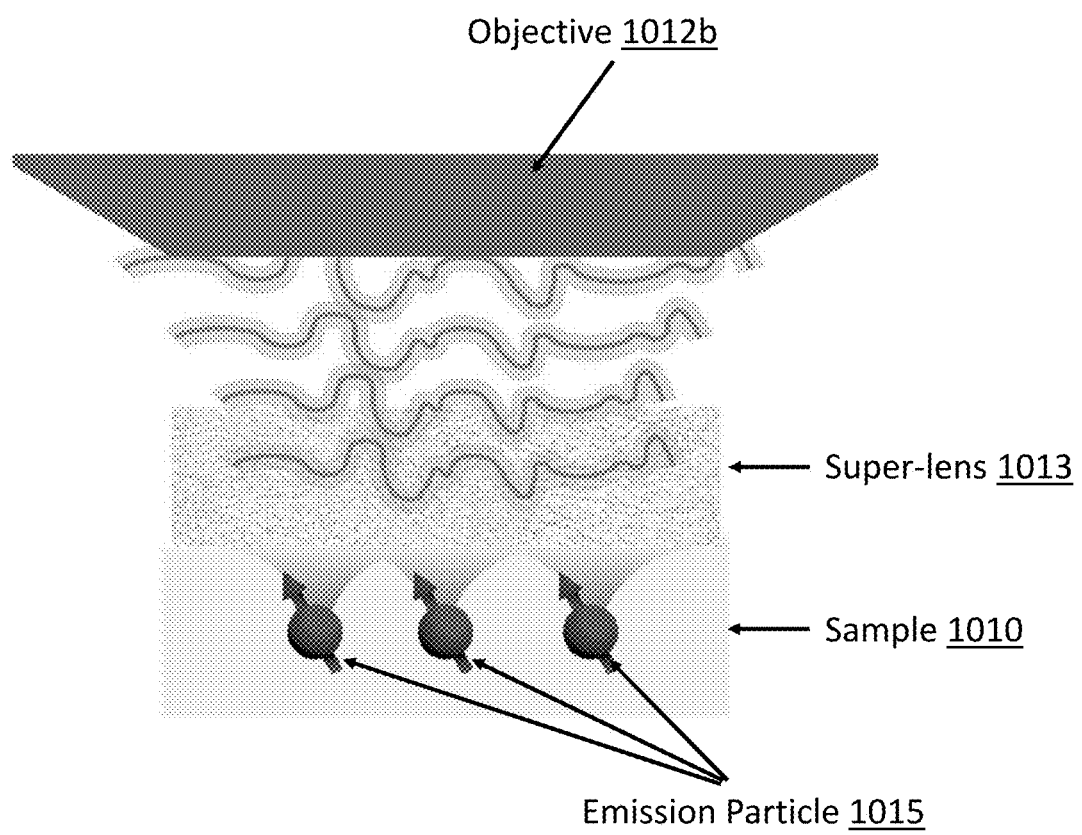
FIG. 10 illustrates an example setup with a super-lens coupled to a sample.

The sample can include an optical super-lens coupled thereto, i.e., a lens embedded with a material useful for extending the resolution of the lens beyond its diffraction limit. Such materials, sometimes also referred to as meta-materials, can include (but are not limited to) gold, silver, and/or the like. In some embodiments, the super-lens is a layer on the sample and interfaces an excitation objective to control delivery of an excitation beam to the sample. Additionally or alternatively, the super-lens could be part of the imaging system itself, e.g., the system 300 and/or the system 900. In some embodiments, each emission particle within the sample includes a solid-state quantum emitter such as, for example, a diamond crystal (e.g., bulk diamond, a diamond nanocrystal, and/or the like) having a nitrogen vacancy color center, or a set thereof. FIG. 10 illustrates an example placement of a super-lens 1013 as coupled to the sample 1010 having emission particles 1015 (e.g., nanodiamonds) embedded therein. The objective 1012b (e.g., similar to the objective 312) then receives the fluorescence emission from the particles 1015 via the super-lens 1013 as illustrates.

The method 800 also includes, at 820, exciting the sample with an excitation beam, such that the excitation beam causes at least one of the emission particles to emit spin-dependent fluorescence, as generally illustrated in FIG. 1B. The excitation beam can include one or more basis modes, as generally illustrated as pixels in FIG. 1A. The sample can be excited from multiple angles of incidence such as by, for example, use of one or more scanning mirrors, acousto-optic deflectors, and/or the like. The excitation beam can include a reference part and a set of basis modes.

In some embodiments, the method 800 may also include applying, to the emission particle(s), a microwave signal to modulate a spin state (e.g., the spin state p, as discussed herein for FIGS. 1-7) of at least one of the emission particles.

The method 800 also includes, at 830, detecting the spin-dependent fluorescence emitted by at least one of the emission particles.

The method 800 also includes, at 840, estimating a position of the emission particle(s) within the sample based on a) the spin-dependent fluorescence, b) the resonance frequency of the emission particle(s), and c) the magnetic field.

The method 800 also includes, at 850, estimating optical transmission information for the sample based on a wavefront of the excitation beam and the estimated position. The optical transmission information includes a measure of an optical field at each position of an emission particle of the plurality of emission particles.

In some embodiments, when the sample is illuminated from multiple incidence angles, the optical transmission information can be further based on/account for the use of such multiple incidences of the excitation beam. In some embodiments, when the excitation beam includes a reference part, a phase of an optical transmission coefficient of the optical transmission information can be determined by, for example, using optical interferometry.

In some embodiments, when the excitation beam includes one or more basis modes (e.g., a set of basis modes), the optical transmission information can include a measure of the optical field for each such basis mode. In such embodiments, the method 800 can further include estimating, for the position of each emission particle and for each basis mode, a feedback parameter to generate a set of feedback parameters. In some embodiments, each feedback parameter is estimated for each emission particle and for each basis mode generally as follows. First, a fluorescence signal (e.g., a first fluorescence signal) is detected as laid out herein for step 830. Then, the microwave signal is applied to the sample with a frequency that is resonant with a frequency of that emission particle. Then, a second fluorescence signal is detected from the sample in response to the excitation beam and the microwave signal, and the feedback parameter can be estimated for that emission particle and that basis mode based on the second fluorescence signal.

In some additional or alternative embodiments, the feedback parameter can be estimated (again, for each emission particle and each basis mode) based on the portion of the excitation beam that is reflected and/or transmitted through the sample, rather than on fluorescence. Generally, the amount of fluorescence from the sample is proportional to the amount of absorption of the excitation beam. Modulating spin-dependent fluorescence with the microwave signal modulates the absorption of the excitation beam, which can be measured by recording the reflected and/or transmitted excitation beam. This modulation of the reflected and/or transmitted excitation beam can then be employed to produce the feedback parameter. Since the reflected and/or transmitted excitation beams are coherent, they can contain additional information that can be decoded.

First, the reflected and/or transmitted portion of the excitation beam is detected, such as via an imaging device, as a first excitation beam signal. Then, the microwave signal is applied to the sample with a frequency that is resonant with a frequency of that emission particle. Then, the reflected and/or transmitted portion of the excitation beam is again detected, this time as a second excitation beam signal, and the feedback parameter can be estimated for that emission particle and that basis mode based on the second excitation beam signal.

This set of feedback parameters can then be used to modify a characteristic of the excitation beam. For example, in some embodiments, the amplitude and/or phase associated with one or more basis modes can be modified using a spatial light modulator.

Figure 9:
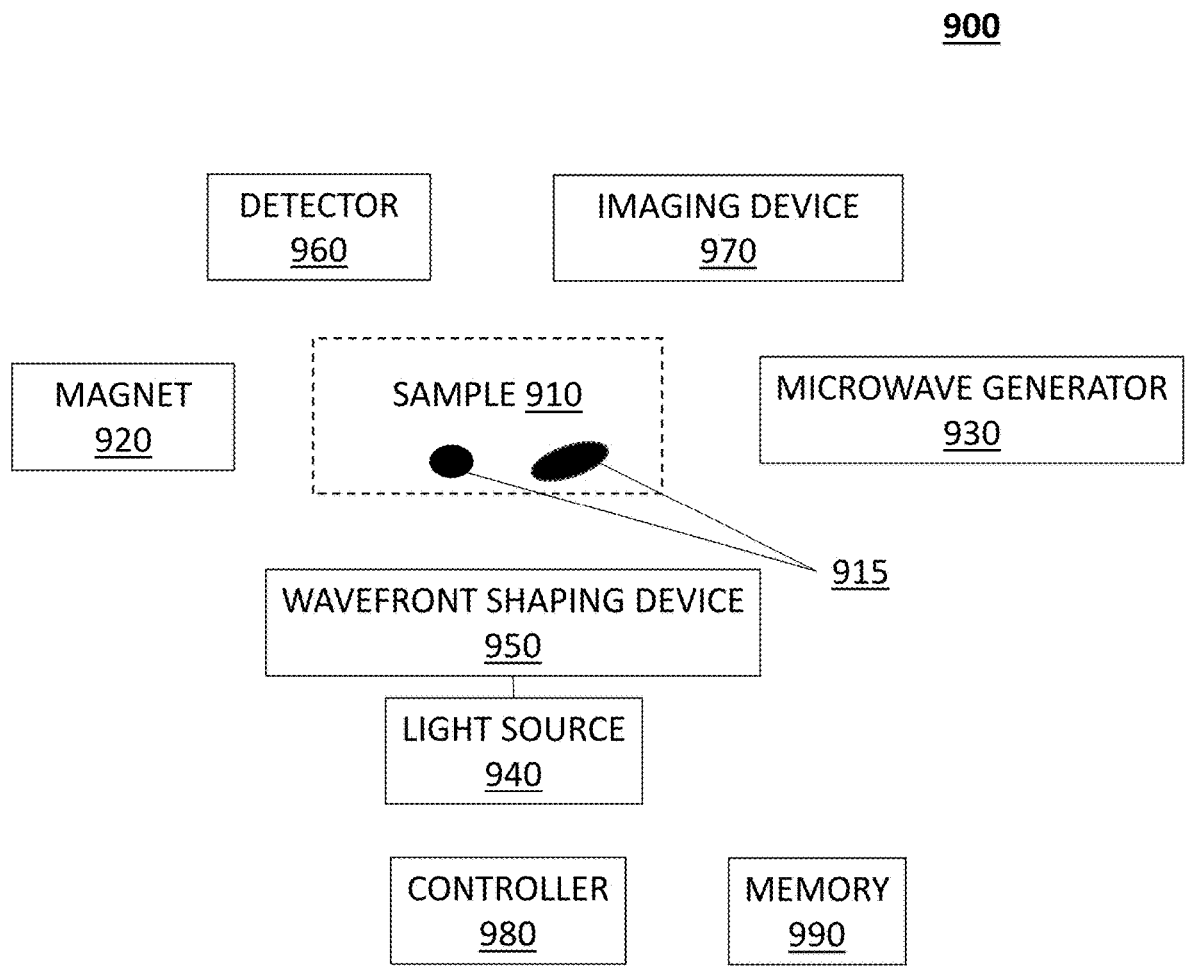
FIG. 9 is a system for optical focusing, according to embodiments.

FIG. 9 is a schematic illustration of an environment/system 900 in which optical focusing in a sample 910 including emission particles 915 (e.g., similar to the nanodiamonds illustrated in FIG. 3A) within the sample as disclosed herein may be implemented and/or carried out. In some embodiments, aspects of the system 900 can be structurally and/or functionally similar to the systems, apparatuses, and/or devices described herein with respect to FIGS. 3A-3C, and/or can perform at least part of the method described in FIG. 8.

The system 900 can interface with the sample 910 including the emission particles 915 in any suitable manner, and (as indicated here by dotted lines) the sample 910 need not constitute part of the system 900. The system 900 includes a magnet 920, a microwave generator 930, a light source 940, a wavefront shaping device 950 in optical communication with the light source, a detector 960, and a controller 980. In some embodiments, the system 900 (as illustrated) can also include an imaging device 970 and a memory 990. Unless explicitly noted otherwise, any of these components may be in communication with each other in any suitable manner (e.g., optical, electronic, electrical, and/or the like).

In some embodiments, all components of the system 900 can be included in a common casing such as, for example, a single housing that presents the system 900 as an integrated, one-piece apparatus for a user. In other embodiments, at least some components of the system 2300 can be in separate locations, housings, and/or apparatuses. For example, in some embodiments, the controller 980 and the memory 990 can be included in a separate compute device can be a smartphone in communication with the other components via one or more networks, each of which can be any type of network such as, for example, a local area network (LAN), a wide area network (WAN), a virtual network, a telecommunications network, and/or the Internet, implemented as a wired network and/or a wireless network. Any or all communications can be secured (e.g., encrypted) or unsecured, as is known in the art. The system 900 can be or encompass a personal computer, a server, a work station, a tablet, a mobile device, a cloud computing environment, an application or a module running on any of these platforms, and/or the like.

The system 900 can also encompass a database (not shown), although it will be understood that, in some embodiments, the database and the memory 990 can be a common data store. The system 900 can also include one or more input/output (I/O) interfaces (not shown), implemented in software and/or hardware, for other components of the system 900, and/or external to the system 900, to interact with the system.

The memory 990 and/or the database can independently be, for example, a random access memory (RAM), a memory buffer, a hard drive, a database, an erasable programmable read-only memory (EPROM), an electrically erasable read-only memory (EEPROM), a read-only memory (ROM), Flash memory, and/or so forth. The memory 990 and/or the database can store instructions to cause the controller 980 to execute processes and/or functions associated with the system 900 such as, for example, one or more steps of the method 800.

The controller 980 can be any suitable processing device configured to run and/or execute a set of instructions or code associated with the system 900. The controller 980 can be, for example, a specially programmed processor, Field Programmable Gate Array (FPGA), Application Specific Integrated Circuit (ASIC), or Digital Signal Processor (DSP).

Explained with reference to a typical use scenario, the sample 910 can be a scattering sample and the emission particles 915 embedded therein can exhibit spin-dependent fluorescence. In some embodiments, each emission particle can include a solid-state quantum emitter such as, for example, a diamond nanocrystal having a nitrogen vacancy center.

The magnet 920 can apply, to the sample 910, a magnetic field that shifts a resonance frequency of each emission particle 915 in a position-dependent manner. In some embodiments, the magnetic field has a gradient, that results in the resonance frequency shift of the emission particles 915. In some embodiments, the magnetic field has a constant magnitude (e.g., a constant peak magnitude) as well as a constant gradient that results in the resonance frequency shift of the particles 915 based on both their position as well as orientation. In some embodiments, the magnet 920 and/or the sample 910 are movable with respect to each other, such that the magnet 920 (e.g., when it includes 2 or more electromagnets) can apply the gradient magnetic field along two or more axis of the sample to ascertain the position/orientation of the emission particles 915 in two or more dimensions. As noted herein with respect to Eq. 2 and generally described with respect to FIG. 3A, in some cases the QRBs can have different orientation, and the magnet 920 can be used to generate a constant field that can be used to probe the QRBs via Zeeman splitting and direct fluorescence imaging For example, the magnet can apply the magnetic field sequentially along a first, second, third axis (e.g., an X, Y, Z axis, respectively) to accurately ascertain the position/orientation of each emission particle 915 in space, and within the sample 910. In some embodiments, the magnet 920 can include a permanent magnet such as that including magnetic metallic elements, rare-earth magnets, and/or the like. In some embodiments, the magnet 920 can include an electromagnet controllable by the controller 980.

In a non-limiting example, the magnet 920 encompasses a set of three electromagnets generating magnetic fields $B_x(r)=(x,0,0)$, $B_y(r)=(0,x,0)$, and $B_z(r)=(0,0,x)$. In some cases, one of the magnetic field gradients can be suitably increased as needed, such as due to sample degeneracy (e.g., $B_x(r)=(10x,0,0)$). The electromagnet generating $B_x(r)$ is turned on, and the ODMR spectrum is measured, which gives a set of resonance frequencies $(v_x(x))$. Similarly, $B_y(r)$ and $B_z(r)$ are turned on sequentially, the corresponding ODMR spectra are measured and consequently sets of resonance frequencies $\{v_y(x)\}$ and $(v_z(x))$, respectively are determined. To determine the position x from $v_x(x)$, $v_y(x)$, $v_z(x)$, the following equations can be solved:

$$\gamma_e \times \{x\} \times \sin[\{\theta(x)\}] \times \cos[\{\varphi(x)\}] = \{v_x(x)\}$$

$$\gamma_e \times \{x\} \times \sin[\{\theta(x)\}] \times \sin[\{\varphi(x)\}] = \{v_y(x)\}$$

$$\gamma_e \times \{x\} \times \cos[\{\theta(x)\}] = \{v_z(x)\}$$

The following equation can also be considered in evaluating the position x:

$$\gamma_e \times \{x\} = (\{v_x(x)\}^2 + \{v_y(x)\}^2 + \{v_z(x)\}^2)^{1/2}$$

The microwave generator 930, which can be similar to the microwave source in FIG. 3B, can generate and apply a microwave signal to the sample 910, which in turn modulates the spin state of at least one of the emission particles 915. The light source 940 and the wavefront shaping device 950 collective generate and apply an excitation beam to excite the sample, which results in spin-dependent fluorescence from at least one of the emission particles. The excitation beam can include a set of basis modes (e.g., shown as individual pixels in FIG. 1A), and the wavefront shaping device 950 can be designed to manipulate/modify one or more characteristics (e.g., amplitude, phase) of each basis mode separately. In some embodiments, the light source 940 can excite the sample from different angles of incidence such as, for example, by using one or more scanning mirrors, acousto-optic deflectors, and/or the like to modify incidence of the excitation beam on the sample 910.

The light source 940 can be any suitable light source to affect excitation of the emission particles 915, such as, for example, the 532 nm laser illustrated in FIG. 3B, a light source emitting in the 532-635 nm wavelength range, etc., and may depend on the fluorescence characteristics of the emission particles 915. The wavefront shaping device 950 can include any spatial light modulator such as, but is not limited to, a digital micromirror device (DMD, as illustrated in FIG. 3B), a liquid crystal-on-silicon spatial light modulator, a magneto-optic spatial light modulator, and a deformable spatial light modulator.

The detector 960 detects the spin-dependent fluorescence of the emission particles 915 emanating from the sample 910. In some embodiments, the detector 960 is a spectroscopic detector such as, for example, a single-photon counting module (SPCM) as illustrated in FIG. 3B.

The controller 980, which is communicably coupled to the detector 960, can then estimate/compute the position of each emission particle 915 within the sample based on a combination of the spin dependent fluorescence, the (known) resonant frequency of the emission particles 915, and the magnetic field. As generally explained with reference to FIGS. 1-7, this estimation of the position can then be employed to estimate optical transmission properties (e.g., the optical transmission matrix T) of the scattering sample 910; accordingly, the controller 980 can estimate optical transmission information for the sample based on the wavefront of the excitation beam and the estimation positions of the emission particles 915. This optical transmission information can include a measure of optical field at each position of an emission particle 915 within the sample 910. In some embodiments, the optical transmission information can be specific for each basis mode of the excitation beam, i.e., it can include a measure of optical field for each basis mode. In some embodiments, when the light source 920 can excite the sample via multiple angles of incidence, the optical transmission information can account for, and/or otherwise be based on, the differing incident angles of the excitation beam, and particularly of the differing incident angles of the basis modes of the excitation beam.

The controller 980 can further estimate one or more feedback parameters (e.g., the QRB-GS feedback) that can be applied to the wavefront shaping device 950 to manipulate the wavefront of the excitation beam for sub-resolution focusing into the sample 910. When done iteratively, the wavefront of the excitation beam can be optimized for imaging the sample 910.

In some embodiments, the controller 980 can estimate the feedback parameter for each emission particle and each basis mode, generally as follows. First, the fluorescence signal (e.g., a first fluorescence signal) is detected as disclosed herein. Then, after the microwave generator 930 applies the microwave signal to the sample 910, a second fluorescence signal is acquired by the detector 960, which can then also be employed to estimate that feedback parameter.

In some additional or alternative embodiments, the controller 980 can estimate the feedback parameter (again, for each emission particle and each basis mode) based on the portion of the excitation beam that is reflected and/or transmitted through the sample, rather than on fluorescence, generally as follows. First, the reflected and/or transmitted wavefront of the excitation beam is detected via the imaging device 970 as a first excitation beam signal. Then, the microwave signal is applied to the sample with a frequency that is resonant with a frequency of that emission particle. Then, the reflected and/or transmitted wavefront of the excitation beam is again detected, this time as a second excitation beam signal, and the feedback parameter can be estimated for that emission particle and that basis mode based on the second excitation beam signal. The wavefront shaping device 950 can, based on the feedback parameter, modify at least one characteristic (e.g., phase, amplitude) of the wavefront of the excitation beam for that basis mode. In some embodiments, the controller 980 controls actuation of the elements of the wavefront shaping device 950 to affect wavefront modification.

As generally disclosed herein with respect to FIGS. 1-7, in some embodiments, the system 900 can encompass a microscopy-based imaging system that includes an objective lens (as best illustrated by the 100× objective lens in FIG. 3B) coupled to the sample 910 and having a numerical aperture NA. The resolution of conventional imaging systems including such objectives is $\lambda/(2*NA)$ at best, with $\lambda$ being a center wavelength of fluorescence of the emission particles 915. Aspects of the feedback-based modulation of the excitation wavefront as disclosed herein, however, permit sub-resolution imaging below the $\lambda/(2*NA)$ limit, providing improved resolution in samples that otherwise significantly scatter any fluorescence emanating from within.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments disclosed herein may be implemented using hardware, software or a combination thereof. When implemented in software, the software code can be executed on any suitable processor or collection of processors, whether provided in a single computer or distributed among multiple computers.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All publications, patent applications, patents, and other references mentioned herein are incorporated by reference in their entirety.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method, comprising:
applying, to a sample exhibiting optical scattering and having a plurality of emission particles distributed therein that exhibit spin-dependent fluorescence, a magnetic field to shift a resonance frequency of each emission particle of the plurality of emission particles in a position-dependent manner;
exciting the sample with an excitation beam, such that the excitation beam causes at least one of the plurality of emission particles to emit spin-dependent fluorescence;
detecting the spin-dependent fluorescence emitted by at least one of the plurality of emission particles;
estimating a position of the at least one of the plurality of emission particles within the sample based on the spin-dependent fluorescence, the resonance frequency of the at least one of the plurality of emission particles, and the magnetic field; and
estimating optical transmission information for the sample based on a wavefront of the excitation beam and the estimated position, the optical transmission information including a measure of an optical field at each position of an emission particle of the plurality of emission particles.

2. The method of claim 1, further comprising applying, to the plurality of emission particles, a microwave signal to modulate a spin state of at least one of the plurality of emission particles.

3. The method of claim 1, wherein each emission particle of the plurality of emission particles includes a solid-state quantum emitter.

4. The method of claim 3, wherein the solid-state quantum emitter is a diamond nanocrystal having a nitrogen vacancy color center.

5. The method of claim 1, wherein the magnetic field has a gradient, such that the applying the magnetic field shifts the resonance frequency of each emission particle based on the position of that emission particle within the sample.

6. The method of claim 1, wherein the magnetic field has a constant magnitude or a constant gradient, and wherein the applying the magnetic field shifts the resonance frequency of each emission particle of the plurality of emission particles based on the position and an orientation of that emission particle within the sample.

7. The method of claim 1, the applying the magnetic field further including:
applying the magnetic field along a first axis of the sample, such that the estimating the position includes estimating the position of that emission particle along the first axis;
applying the magnetic field along a second axis of the sample, the second axis orthogonal to the first axis, such that the estimating the position includes estimating the position of that emission particle along the second axis; and
applying the magnetic field along a third axis of the sample, the third axis orthogonal to the first axis and to the second axis, such that the estimating the position includes estimating the position of that emission particle along the third axis.

8. The method of claim 1, the exciting the sample including exciting the sample from a plurality of angles of incidence with the excitation beam, the estimating the optical transmission information further based on the plurality of angles of incidence.

9. The method of claim 8, further comprising:
applying a reference excitation beam to the sample to determine a phase of an optical transmission coefficient of the optical transmission information using one or more optical interferometric techniques.

10. The method of claim 1, where the excitation beam includes a set of basis modes, and wherein the optical transmission information including the measure of optical field for each basis mode of the set of basis modes.

11. The method of claim 10, further comprising:
estimating, for the position of each emission particle and for each basis mode, a feedback parameter to generate a set of feedback parameters;
modifying at least one characteristic of the excitation beam based on the set of feedback parameters.

12. The method of claim 11, wherein the fluorescence is a first fluorescence signal, the estimating the feedback parameter further including, for each emission particle and each basis mode:
applying a microwave signal to the sample, a frequency of the microwave sample being resonant with the resonance frequency of that emission particle;

detecting a second fluorescence signal emitted by the sample in response to the excitation beam and the microwave signal; and
estimating the feedback parameter for that emission particle and for that basis mode based on the second fluorescence signal.

13. The method of claim 11, further comprising detecting at least a portion of the excitation beam reflected from or transmitted through the sample as a first excitation beam signal, the estimating the feedback parameter further including, for each emission particle and each basis mode:
applying a microwave signal to the sample, a frequency of the microwave sample being resonant with the resonance frequency of that emission particle;
detecting a second excitation beam signal reflected from or transmitted through the sample in response to the excitation beam and the microwave signal; and
estimating the feedback parameter for that emission particle and for that basis mode based on the second excitation beam signal.

14. The method of claim 12, the modifying further comprising modifying at least one characteristic of at least one basis mode of the excitation beam based on the set of feedback parameters.

15. A system, comprising:
a magnet to apply, to a sample exhibiting optical scattering and having a plurality of emission particles distributed therein that exhibit spin-dependent fluorescence, a magnetic field to shift a resonance frequency of each emission particle of the plurality of emission particles in a position-dependent manner;
a microwave generator to generate and apply a microwave signal to the sample to modulate the spin state of at least one emission particle of the plurality of emission particles;
a light source to excite the sample with an excitation beam, such that the excitation beam causes at least one emission particle of the plurality of emission particles to emit spin-dependent fluorescence;
a detector to detect the spin-dependent fluorescence; and
a controller to:
estimate a position of the at least one of the plurality of emission particles within the sample based on the spin-dependent fluorescence, the resonance frequency of the at least one of the plurality of emission particles, and the magnetic field; and
estimate optical transmission information for the sample based on a wavefront of the excitation beam and the estimated position, the optical transmission information including a measure of an optical field at each position of an emission particle of the plurality of emission particles.

16. The system of claim 15, wherein each emission particle of the plurality of emission particles includes a solid-state quantum emitter.

17. The system of claim 16, wherein the solid-state quantum emitter is a diamond nanocrystal having a nitrogen vacancy center.

18. The system of 15, wherein the magnetic field has a gradient to shift the resonance frequency of each emission particle based on the position of that emission particle in the sample.

19. The system of claim 15, wherein the magnetic field has a constant magnitude or a constant gradient to shift the resonance frequency of each emission particle based on the position and an orientation of that emission particle in the sample.

20. The system of claim 15, wherein the excitation beam includes a set of basis modes, and wherein the optical transmission information includes the measure of optical field for each basis mode of the set of basis modes.

21. The system of claim 20, wherein the controller estimates, for the position of each emission particle and for each basis mode, a feedback parameter to generate a set of feedback parameters.

22. The system of claim 21, wherein the fluorescence is a first fluorescence signal, wherein the controller estimates the feedback parameter by, for the each emission particle and the each basis mode:
controlling the microwave generator to apply a microwave signal to the sample, a frequency of the microwave sample being resonant with the resonance frequency of that emission particle;
controlling the detector to detect a second fluorescence signal emitted by the sample in response to the excitation beam and the microwave signal; and
estimating the feedback parameter for that emission particle and for that basis mode based on the second fluorescence signal.

23. The system of claim 21, further comprising an imaging device for detecting at least a portion of the excitation beam reflected from or transmitted through the sample as a first excitation beam signal, wherein the controller estimates the feedback parameter by, for the each emission each basis mode:
controlling the microwave generator to apply the microwave signal to the sample, a frequency of the microwave sample being resonant with the resonance frequency of that emission particle;
controlling the imaging device to detect a second excitation beam signal reflected from or transmitted through the sample in response to the excitation beam and the microwave signal; and
estimating the feedback parameter for that emission particle and for that basis mode based on the second excitation beam signal.

24. The system of claim 21, further comprising a wavefront shaping device to receive the excitation beam and to modify at least one characteristic of at least one basis mode of the excitation beam based on the set of feedback parameters.

25. The system of claim 15, further comprising an objective lens coupled to the sample and having a numerical aperture NA, wherein the fluorescence has a center wavelength $\lambda$ and wherein the controller and the second detector generate an image of the fluorescence at a spatial resolution that is less than $\lambda/(2*NA)$.

26. The system of claim 15, wherein the magnet applies the magnetic field by:
applying the magnetic field along a first axis of the sample, such that the controller estimates the position by estimating the position of that emission particle along the first axis;
applying the magnetic field along a second axis of the sample, the second axis orthogonal to the first axis, such that the controller estimates the position by estimating the position of that emission particle along the second axis; and
applying the magnetic field along a third axis of the sample, the third axis orthogonal to the first axis and to the second axis, such that the controller estimates the position by estimating the position of that emission particle along the third axis.

27. The system of claim 15, wherein the light source excites the sample by exciting the sample from a plurality of angles of incidence of the excitation beam, and wherein the controller estimates the optical transmission information further based on the plurality of angles of incidence.

28. The system of claim 27, further comprising one or more scanning mirrors to modify incidence of the excitation beam on the sample to effect excitation of the sample from the plurality of angles of incidence of the excitation beam.

29. The system of claim 27, further comprising one or more acousto-optic deflectors to modify incidence of the excitation beam on the sample to effect excitation of the sample from the plurality of angles of incidence of the excitation beam.

30. A system, comprising:
a magnet, in electromagnetic communication with a sample exhibiting optical scattering and having a plurality of diamond nanoparticles distributed therein with nitrogen vacancy centers that exhibit spin-dependent fluorescence, to apply a magnetic field having a gradient, such that the magnetic field shifts a resonance frequency of each nitrogen vacancy center in the plurality of diamond nanoparticles based on a position of that nitrogen vacancy center in the sample;
a light source to emit an excitation beam;
a wavefront shaping device, in optical communication with the light source and the sample, to excite the sample with the excitation beam, the excitation beam including a set of basis modes, such that the excitation beam causes at least one nitrogen vacancy center in the plurality of diamond nanoparticles to emit spin-dependent fluorescence;
a detector, in optical communication with the sample, to detect the spin-dependent fluorescence emitted by the sample; and
a controller, operably coupled to the detector and the wavefront shaping device, to:
estimate a position of the at least one nitrogen vacancy center in the plurality of diamond nanoparticles within the sample based on the spin-dependent fluorescence, the resonance frequency of the at least one nitrogen vacancy center in the plurality of diamond nanoparticles, and the magnetic field;
generating an optical transmission matrix for the sample based on a wavefront of the excitation beam and the estimated position, the optical transmission matrix including a measure of an optical field at a position of each nitrogen vacancy center in the plurality of diamond nanoparticles, and for each basis mode of the set of basis modes;
estimate, for the position of each nitrogen vacancy center in the plurality of diamond nanoparticles and for each basis mode, a feedback parameter to generate a set of feedback parameters; and
actuate the wavefront shaping device to modify at least one characteristic of at least one basis mode of the excitation beam based on the set of feedback parameters.

* * * * *